(12) United States Patent
Chang

(10) Patent No.: US 11,935,798 B2
(45) Date of Patent: Mar. 19, 2024

(54) STACKED SEMICONDUCTOR DEVICE TEST CIRCUITS AND METHODS OF USE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 259 days.

(21) Appl. No.: 17/304,982

(22) Filed: Jun. 29, 2021

(65) Prior Publication Data

US 2022/0344223 A1 Oct. 27, 2022

Related U.S. Application Data

(60) Provisional application No. 63/201,298, filed on Apr. 22, 2021.

(51) Int. Cl.
| | |
|---|---|
| *H01L 21/66* | (2006.01) |
| *H01L 23/00* | (2006.01) |
| *H01L 23/48* | (2006.01) |
| *H01L 25/10* | (2006.01) |

(52) U.S. Cl.
CPC ............ *H01L 22/32* (2013.01); *H01L 22/22* (2013.01); *H01L 22/34* (2013.01); *H01L 23/481* (2013.01); *H01L 24/32* (2013.01); *H01L 25/105* (2013.01); *H01L 2224/32146* (2013.01); *H01L 2225/1047* (2013.01)

(58) Field of Classification Search
CPC ......... H01L 22/32; H01L 22/22; H01L 22/34; H01L 23/481; H01L 24/32; H01L 25/105; H01L 2224/32146; H01L 2225/1047; H01L 24/08
See application file for complete search history.

(56) References Cited

U.S. PATENT DOCUMENTS

2017/0343603 A1* 11/2017 Chakrabarty ...... G01R 31/2884

* cited by examiner

*Primary Examiner* — Robert G Bachner
(74) *Attorney, Agent, or Firm* — Harrity & Harrity, LLP

(57) ABSTRACT

A control circuit is included in a first die of a stacked semiconductor device. The first die further includes a transistor that is electrically connected to the control circuit. The transistor is configured to be controlled by the control circuit to selectively block a die-to-die interconnect. In this way, the die-to-die interconnect may be selectively blocked to isolate the first die and a second die of the stacked semiconductor device for independent testing after bonding. This may increase the effectiveness of a testing to identify and isolate defects in the first die or the second die, which may further increase the effectiveness of performing rework or repair on the stacked semiconductor device.

20 Claims, 24 Drawing Sheets

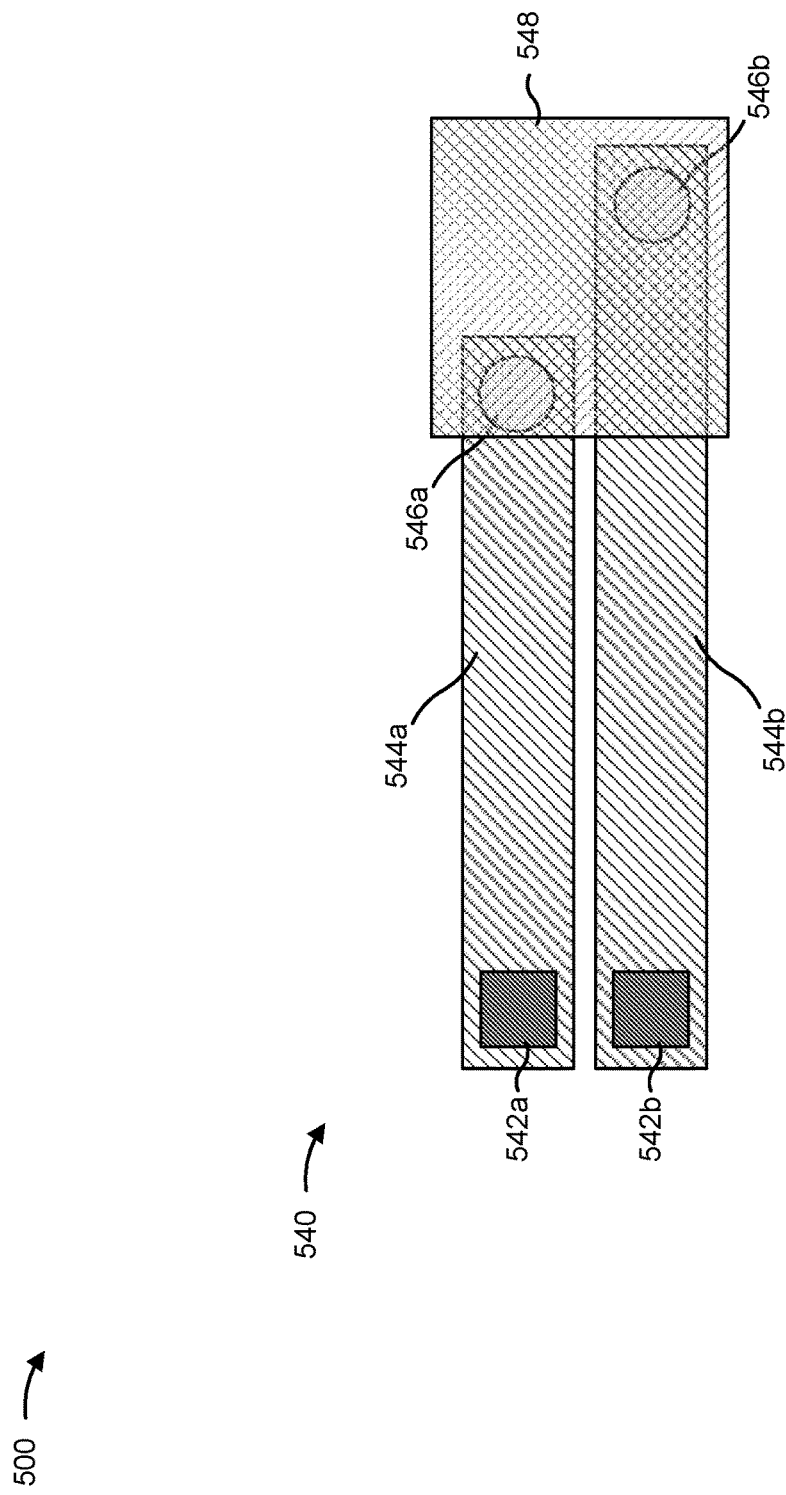

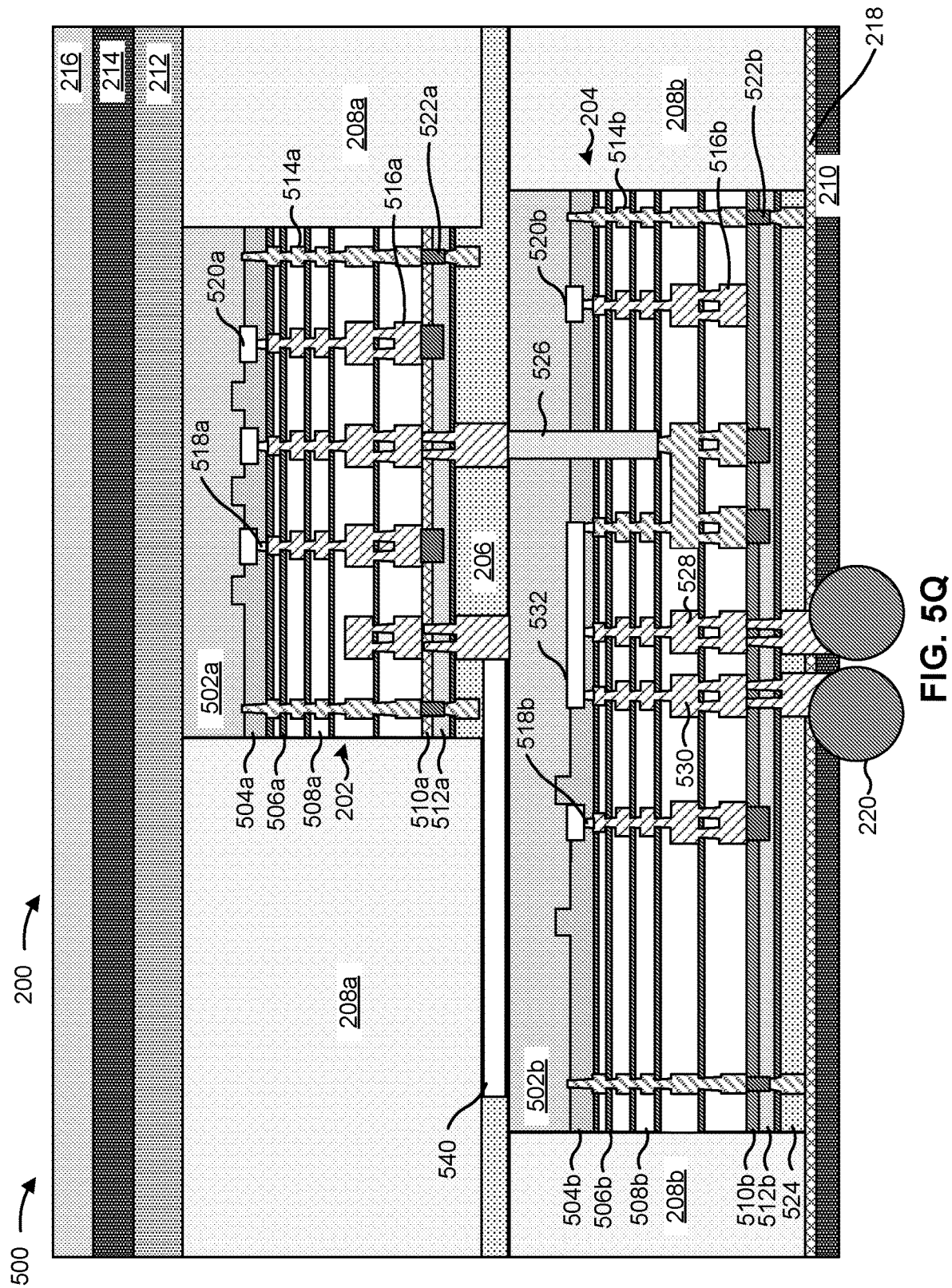

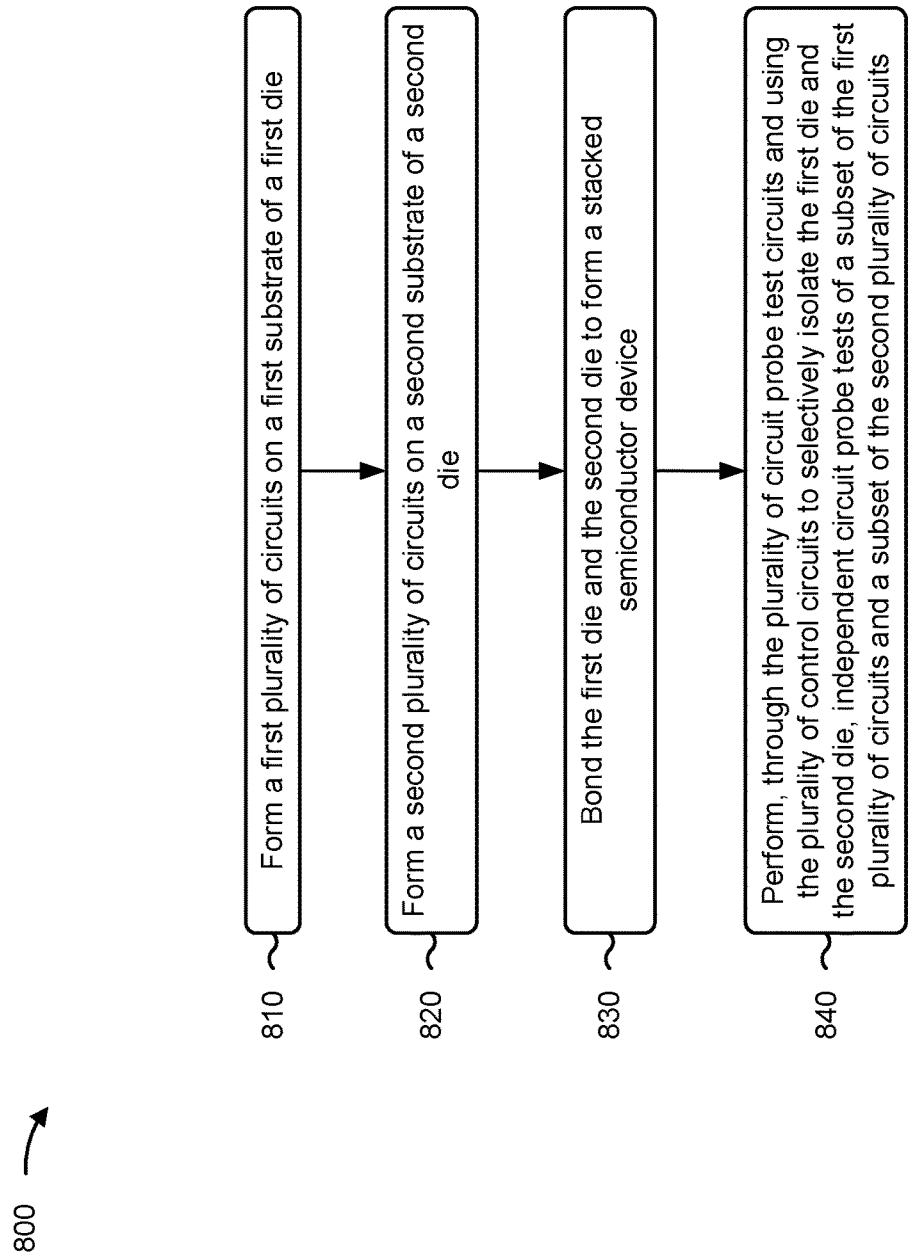

STACKED SEMICONDUCTOR DEVICE TEST CIRCUITS AND METHODS OF USE

CROSS-REFERENCE TO RELATED APPLICATION

This patent application claims priority to U.S. Provisional Patent Application No. 63/201,298, filed on Apr. 22, 2021, and entitled "STACKED SEMICONDUCTOR DEVICE TESTING." The disclosure of the prior application is considered part of and is incorporated by reference into this patent application.

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flowchart of an example process relating to forming a stacked semiconductor device described herein.

DETAILED DESCRIPTION

Figure 1:
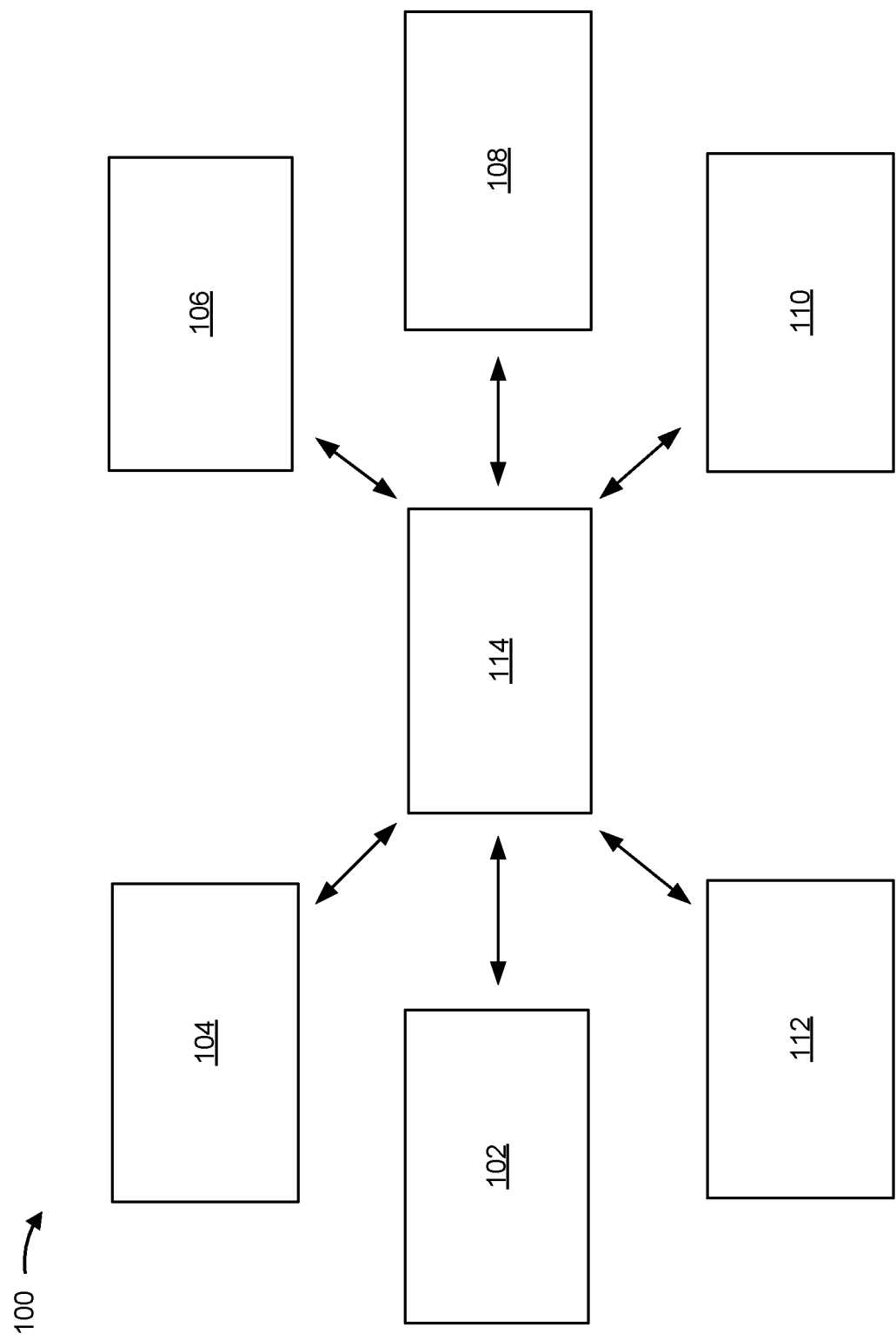
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

After a first die (e.g., a system on integrated circuit (SoIC) die or another type of die) is stacked on a second die to form a stacked semiconductor device, a circuit probe (CP) and/or a wafer acceptance test (WAT) is performed on the entire stacked semiconductor device. As a result, the individual dies of the stacked semiconductor device are not separately tested, which can increase the difficulty of troubleshooting and identifying defects and/or performing rework/repair processes for the stacked semiconductor device. Moreover, a WAT may not be performed after bonding to test the bonding performance, which may result in unidentified bonding defects that can reduce manufacturing yield.

In some implementations described herein, a control circuit is included in a first die of a stacked semiconductor device. The first die further includes a transistor that is electrically connected to the control circuit. The transistor is configured to be controlled by the control circuit to selectively block a die-to-die interconnect (e.g., a wire or a through substrate via (TSV)). In this way, the die-to-die interconnect may be selectively blocked to isolate the first die and a second die of the stacked semiconductor device for independent testing after bonding. This may increase the effectiveness of a CP and/or a WAT to identify and isolate defects in the first die or the second die, which may further increase the effectiveness of performing rework or repair on the stacked semiconductor device.

In some implementations, the stacked semiconductor device includes a bonding layer test line at or near a bonding layer between the first die and the second die. The bonding layer is used to selectively connect the first die or the second die to a test pad such that electrical properties of the bonding layer may be separately tested for the first die and the second die.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
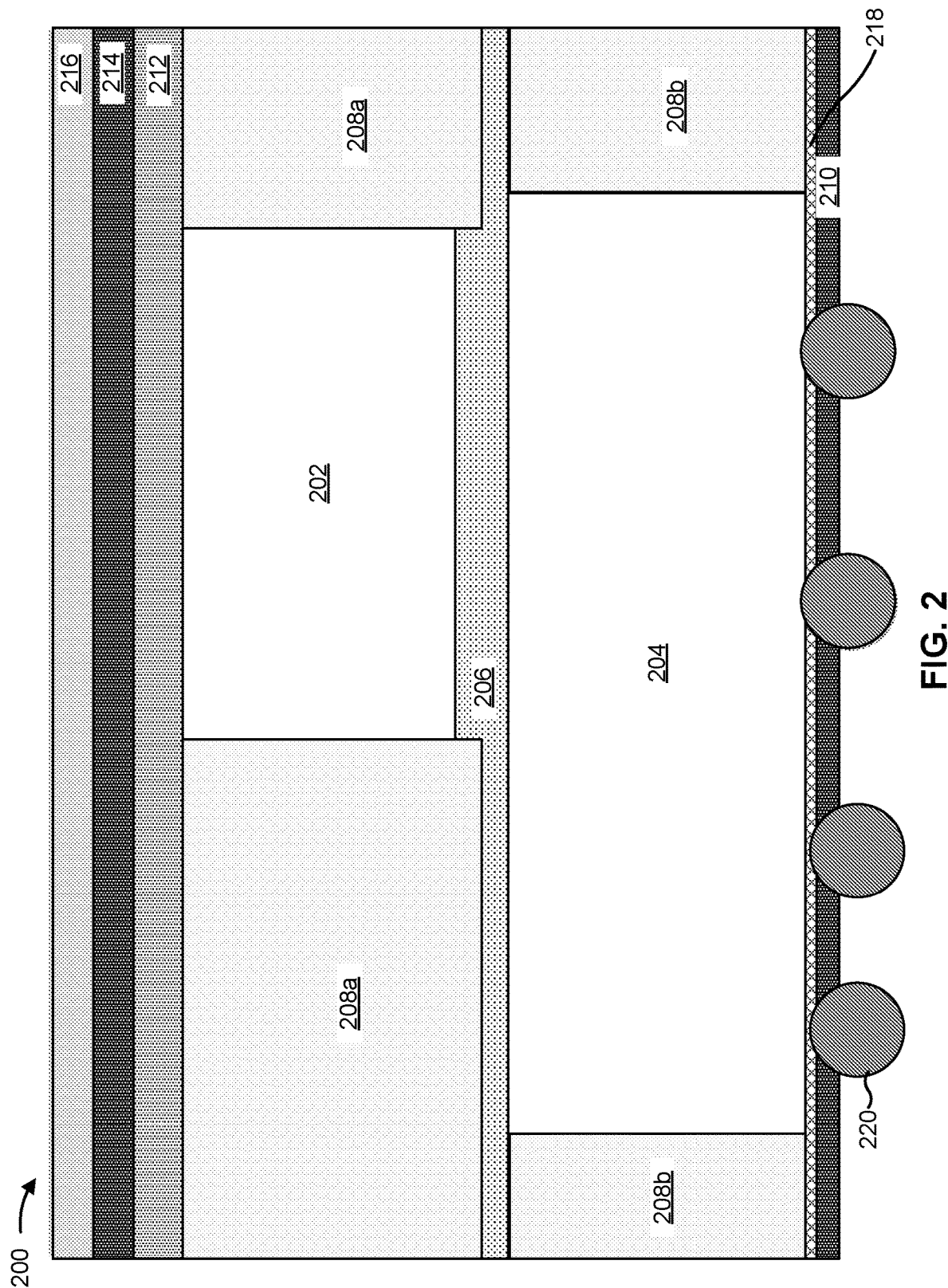
FIG. 2 is a diagram of an example stacked semiconductor device described herein.

FIG. 2 is a diagram of an example stacked semiconductor device 200 described herein. The stacked semiconductor device 200 includes an example of a memory device (e.g., a static random access memory (SRAM), a dynamic random access memory (DRAM)), a logic device, a processor, an input/output device (e.g., an integrated fanout (InFo) device or another type of input/output device), an SoIC device, a chip on wafer on substrate (CoWoS) device, a three-dimensional inter-chip (3D IC) device, a micro electromechanical system (MEMS) device, and/or another type of semiconductor device in which dies are stacked or vertically arranged.

The stacked semiconductor device 200 includes stacked dies 202 and 204. Each of the die 202 and the die 204 include a system on chip (SoC), a logic device, a sensor device, a processor device, and/or another type of semiconductor device. The die 202 and the die 204 are bonded together by a bonding layer (or bonding film) 206. The bonding layer 206 includes one or more types of materials such as a silicon oxide ($SiO_x$) (e.g., silicon dioxide ($SiO_2$)) and/or another type of bonding material. The die 202 and the die 204 may be bonded by a bonding technique such as hybrid bonding, fusion bonding, or direct bonding, among other examples.

Gaps on the sides of the die 202 and/or the die 204 are filled with dielectric layers such as tetraethyl orthosilicate (TEOS), a silicon oxide ($SiO_x$) (e.g., silicon dioxide ($SiO_2$)), silicon oxynitride (SiON), and/or another type of dielectric material. As an example, the gaps around the die 202 are filled with a dielectric layer 208a. As another example, the gaps around the die 204 are filed with a dielectric layers 208b. The dielectric layers 208a and 208b provide increased stability and electrical isolation for the dies 202 and 204.

The stacked semiconductor device 200 includes additional bonding layers, including a bonding layer 210, a bonding layer 212, and a bonding layer 214, among other examples. In some implementations, the bonding layers 206, 210, 212, and 214 include the same material or materials. In some implementations, two or more of the bonding layers 206, 210, 212, and 214 include different materials. The bonding layers 212 and 214 may be used to bond the die 202 to a carrier substrate 216, which may include silicon or another carrier substrate material.

A passivation layer 218 may be included between the die 204 and the bonding layer 210 to protect the die 204. The passivation layer 218 may include a silicon nitride ($Si_xN_y$), an undoped silicate glass (USG), a silicon oxide ($SiO_x$) (e.g., silicon dioxide ($SiO_2$)), and/or another type of passivation material. The bonding layer 210 may be used to bond the stacked semiconductor device to solder balls (or solder bumps) 220, which may be used to bond the stacked semiconductor device 200 to an interposer structure or another device.

As indicated above, FIG. 2 is provided as an example. Other examples may differ from what is described with regard to FIG. 2.

Figure 3:
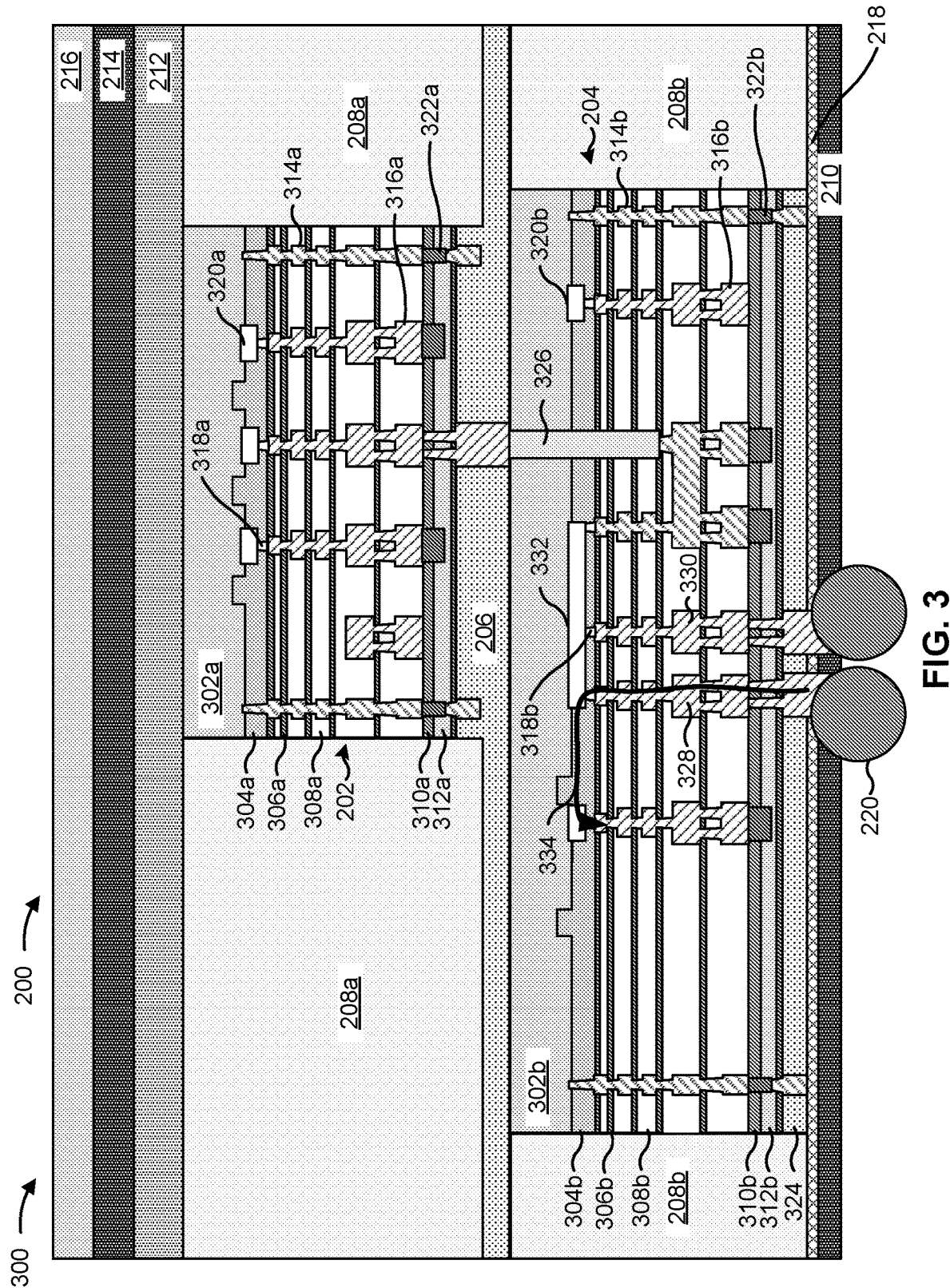
FIGS. 3 and 4 are diagrams of example portions described herein of the stacked semiconductor device of FIG. 2.

FIG. 3 is a diagram of a portion 300 described herein of the example stacked semiconductor device 200. The portion 300 includes an example of a portion of the stacked semiconductor device 200 that includes a test circuit, a control circuit, and a transistor configured to selectively block a die-to-die interconnect between the die 202 and the die 204 to enable independent testing of the die 202 and the die 204 to be performed.

As shown in FIG. 3, the die 202 and the die 204 each include a substrate (e.g., substrate 302a in the die 202 and substrate 302b in the die 204). The substrates 302a and 302b each includes a silicon (Si) substrate, a substrate formed of a material including silicon, a III-V compound semiconductor material substrate such as gallium arsenide (GaAs), a silicon on insulator (SOI) substrate, or another type of semiconductor substrate.

The die 202 and the die 204 each includes a plurality of stacked layers, including a front end of line (FEOL) interlayer dielectric (ILD) layer (e.g., an FEOL ILD layer 304a on the substrate 302a and an FEOL ILD layer 304b on the substrate 302b). The stacked layers further include a plurality of alternating dielectric layers and etch stop layers (ESLs). As an example, the die 202 includes a plurality of alternating ESLs 306a and dielectric layers 308a that are included over and/or on the FEOL ILD layer 304a. Similarly, the die 204 includes a plurality of alternating ESLs 306b and dielectric layers 308b that are included over and/or on the FEOL ILD layer 304b. The ESLs 306a and 306b include layers of material that are configured to permit various portions of the dies 202 and 204 to be selectively etched or protected from etching to form one or more of the structures included in the dies 202 and 204. The dielectric layers 308a and 308b are included to electrically isolate various structures of the dies 202 and 204. The dielectric layers 308a and 308b include a silicon nitride ($Si_xN_y$), an oxide (e.g., a silicon oxide ($SiO_x$) and/or another oxide material), and/or another type of dielectric material.

The ESLs 306a and the dielectric layers 308a are included in a back end of line (BEOL) region of the die 202. Similarly, the ESLs 306b and the dielectric layers 308b are included in a BEOL region of the die 204. The die 202 includes a passivation layer 310a over and/or on the plurality of alternating dielectric layers 308a and ESLs 306a to passivate the BEOL region and to protect the BEOL region from upper layers of the die 202. The die 204 includes a passivation layer 310b over and/or on the plurality of alternating dielectric layers 308b and ESLs 306b to passivate the BEOL region and to protect the BEOL region from upper layers of the die 204.

A gap fill dielectric layer 312a is included in the die 202 over and/or on the passivation layer 310a and is covered with another ESL 306a. Similarly, a gap fill dielectric layer 312b is included in the die 204 over and/or on the passivation layer 310b and is covered with another ESL 306b. The die 202 includes a plurality of seal rings 314a to protect the die 202 from physical and/or electrical damage during a dicing operation to cut the die 202 from a wafer. The die 204 includes similar seal rings 314b.

As further shown in FIG. 3, the dies 202 and 204 include a plurality of circuits. The die 202 includes circuits 316a and the die 204 includes circuits 316b. The circuits include metallization layers, vias, interconnects, and/or other types of conductive structures. The circuits are configured to transfer signals, voltages, current, and/or other electrical inputs and/or outputs to various areas of the die 202, the die 204, and/or other locations of the stacked semiconductor device 200. The circuits 316a and 316b include a conductive material such as tungsten (W), cobalt (Co), ruthenium (Ru), titanium (Ti), aluminum (Al), copper (Cu), gold (Au), and/or a combination thereof, among other examples of conductive materials.

The circuits are formed over and/or on contacts 318a and 318b. The contacts 318a and 318b include source/drain contacts (or MDs), gate contacts (or CBs, MPs), and/or other types of electrical contacts. The contacts 318a are configured to electrically connect the circuits 316a and transistors 320a included in the die 202. The contacts 318b are configured to electrically connect the circuits 316b and transistors 320b included in the die 204. The contacts 318a and 318b include a conductive material such as tungsten (W), cobalt (Co), ruthenium (Ru), titanium (Ti), aluminum (Al), copper (Cu), gold (Au), and/or a combination thereof, among other examples of conductive materials. The transistors 320a and 320b include planar transistors, fin field effect transistors (finFETs), gate all around (GAA) transistors, and/or other types of transistors.

Metal pads 322a are included over and/or on the circuits 316a and the seal rings 314a, and metal pads 322b are included over and/or on the circuits 316b and the seal rings 314b. The metal pads 322a and 322b may be configured to transfer signals, voltage, currents, and/or other electrical inputs/outputs between circuits of the die 202 and/or the die 204 included in the stacked semiconductor device 200. The metal pads 322a and 322b include aluminum (Al), aluminum copper (AlCu), and/or another conductive material. The die 204 further includes a bonding layer 324, which is used to bond the die 204 to a carrier substrate during manufacturing of the stacked semiconductor device 200.

As further shown in FIG. 3, the stacked semiconductor device 200 includes a die-to-die interconnect 326, which may include a die-to-die wire, a TSV, or another type of die-to-die interconnect. The die-to-die interconnect 326 physically connects to a circuit 316a of the die 202 and a circuit 316b of the die 204, and is configured to provide an electrical connection between the die 202 and the die 204. In this way, electrical inputs and outputs may be provided between the die 202 and the die 204 through the die-to-die interconnect 326. The die-to-die interconnect 326 includes a conductive material such as tungsten (W), cobalt (Co), ruthenium (Ru), titanium (Ti), aluminum (Al), copper (Cu), gold (Au), and/or a combination thereof, among other examples of conductive materials.

The die 204 includes a test circuit 328 that is configured to enable various types of electrical tests to be performed on the die 204 and/or the die 202. The electrical tests include wafer acceptance tests (WATs), circuit probe (CP) tests, and/or other types of electrical tests. To enable independent and/or isolated testing of the die 202 and the die 204, the die 204 includes a control circuit 330 and a transistor 332 configured to selectively isolate the die 202 and the die 204. In particular, the control circuit 330 and the transistor 332 are configured to selectively block a conductive path between the die 202 and the die 204 through the die-to-die interconnect 326. In a first configuration, the control circuit 330 and the transistor 332 may block the conductive path through the die-to-die interconnect 326 (e.g., such that the die 202 and the die 204 are not electrically connected) so that the test circuit 328 may be used to provide a test signal 334 for performing independent electrical testing of the circuits 316b and/or transistors 320b of the die 204. In a second configuration, the control circuit 330 and the transistor 332 provide a conductive path through the die-to-die interconnect 326 (e.g., such that the die 202 and the die 204 are electrically connected), which permits the test signal 334 to travel through the die-to-die interconnect 326 to the die 202 for testing.

The control circuit 330 is connected to the gate of the transistor 332 and is configured to control the operation of the transistor 332. The transistor 332 includes a planar transistor, a finFET, a GAA transistor, a bipolar junction transistor (BJT), or another type of transistor. The control circuit 330 may provide a control signal (e.g., a voltage or a current) to the gate of the transistor 332 to cause a conductive channel to form between the source and the drain of the transistor 332. In this configuration, the transistor 332 is conducting and forms the conductive path through the die-to-die interconnect 326 such that the die 202 and the die 204 are electrically connected. Accordingly, the test signal 334 is permitted to traverse the conductive path through the transistor 332 and through the die-to-die interconnect 326 to the die 202. The control signal is removed from the gate of the transistor 332 to close the conductive channel between the source and the drain of the transistor 332. In this configuration, the transistor 332 is not conducting, and the conductive path through the die-to-die interconnect 326 is blocked such that the die 202 and the die 204 are not electrically connected. Accordingly, the test signal 334 is prevented from traveling to the die 202 and is instead provided to the circuits 316b and transistors 320b of the die 204. In this way, the control circuit 330 and the transistor 332 enable independent testing of the die 202 and the die 204.

As indicated above, FIG. 3 is provided as an example. Other examples may differ from what is described with regard to FIG. 3.

Figure 4:
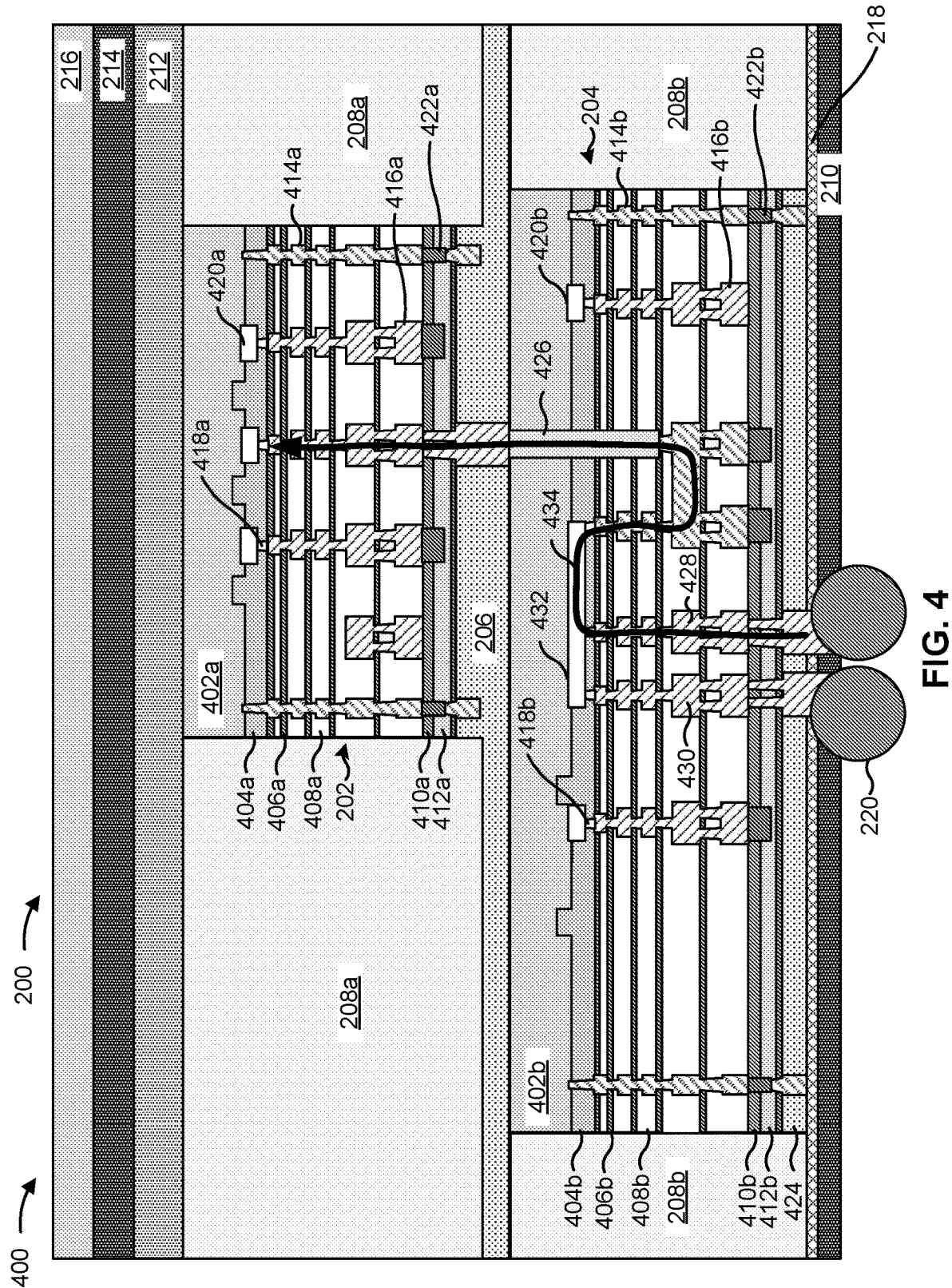

FIG. 4 is a diagram of a portion 400 described herein of the example stacked semiconductor device 200. The portion 400 includes similar structures and arrangements as the portion 300 of the stacked semiconductor device 200. However, the portion 400 includes an example of a portion of the stacked semiconductor device 200 that includes a test circuit 428, a control circuit 430, and a transistor 432 configured to selectively block the circuits 416b and transistors 420b of the die 204.

The control circuit 430 and the transistor 432 may operate in combination to enable independent testing of the die 202 and the die 204. As an example, and as shown in FIG. 4, a control signal is omitted from the control circuit 430 (and/or the control circuit 430 refrains from providing a control signal) to block the conductive path between the test circuit 428 and the circuits 416b and the transistors 420b of the die 204. While the control circuit 430 and transistor 432 block the conductive path between the test circuit 428 and the circuits 416b and the transistors 420b of the die 204, a control signal may be provided to the control circuit 330 (and the control circuit 330 may provide the control signal) to cause the transistor 332 to form the conductive path through the die-to-die interconnect 326 such that the die 202 and the die 204 are electrically connected. In this configuration, the circuits 416a and transistors 420a of the die 202 are isolated (e.g., electrically isolated) from the circuits 416b and transistors 420b of the die 204, which enables independent testing of the circuits 416a and transistors 420a of the die 202 to be performed using a test signal 434 through the die-to-die interconnect 426.

As another example, a control signal may be provided to the gate of the transistor 432 from the control circuit 430 to permit a conductive path to form to the circuits 416b and transistors 420b of the die 204 while the control circuit 330 and the transistor 320 block the conductive path between the die 202 and the die 204. In this configuration, the circuits 416b and transistors 420b of the die 204 are isolated (e.g., electrically isolated) from the circuits 416a and transistors 420a of the die 202, which enables independent testing of the circuits 416b and transistors 420b of the die 204 to be performed using the test signal 334.

As indicated above, FIG. 4 is provided as an example. Other examples may differ from what is described with regard to FIG. 4.

Figure 5A:
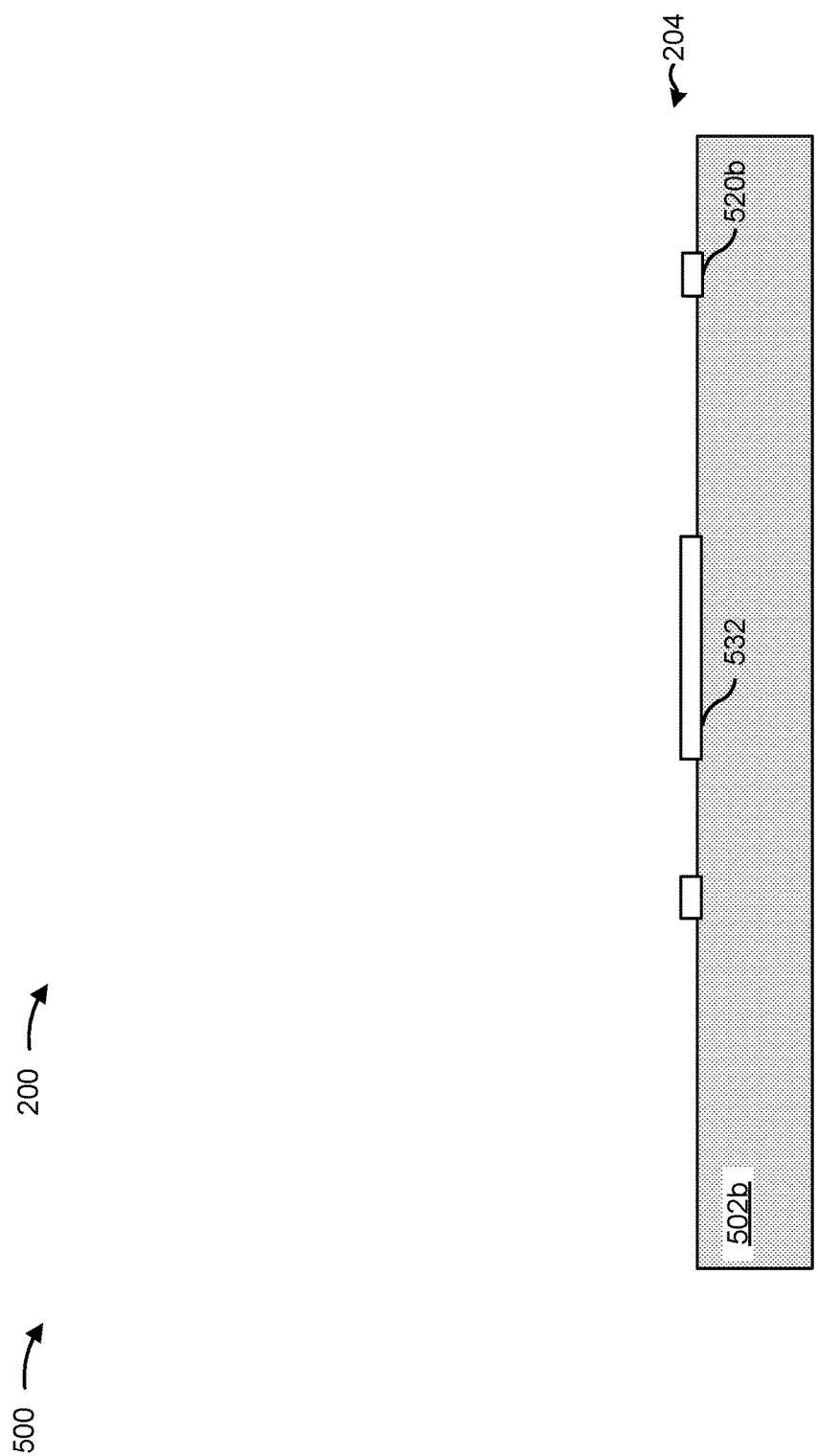
FIGS. 5A-5Q are diagrams of an example implementation described herein.

FIGS. 5A-5Q are diagrams of an example implementation 500 described herein. The example implementation 500 includes a plurality of examples of forming the stacked semiconductor device 200 and independently testing the dies 202 and 204 of the stacked semiconductor device 200.

FIGS. 5A-5H are diagrams of an example process for forming the die 204 (or a portion thereof). However, other processes and techniques may be used to form the die 204. Turning to FIG. 5A, the transistors 520b and the transistor 532 are formed in and/or on the substrate 502b. One or more of the semiconductor processing tools 102-112 may form one or more portions of the transistors 520b and the transistor 532. The deposition tool 102 may use various deposition techniques to deposit layers of the transistors 520b and the transistor 532, to deposit photoresist layers for etching the substrate 502b and/or portions of the deposited layers. The exposure tool 104 may expose the photoresist layers to form patterns in the photoresist layers. The developer tool 106 may develop the patterns in the photoresist layers. The etch tool 108 may etch the substrate 502b and/or portions of the deposited layers to form the structures of the transistors 520b and the transistor 532. The planarization tool 110 may planarize portions of the transistors 520b and the transistor 532. The plating tool 112 may deposit metal structures and/or layers of the transistors 520b and the transistor 532.

Figure 5B:
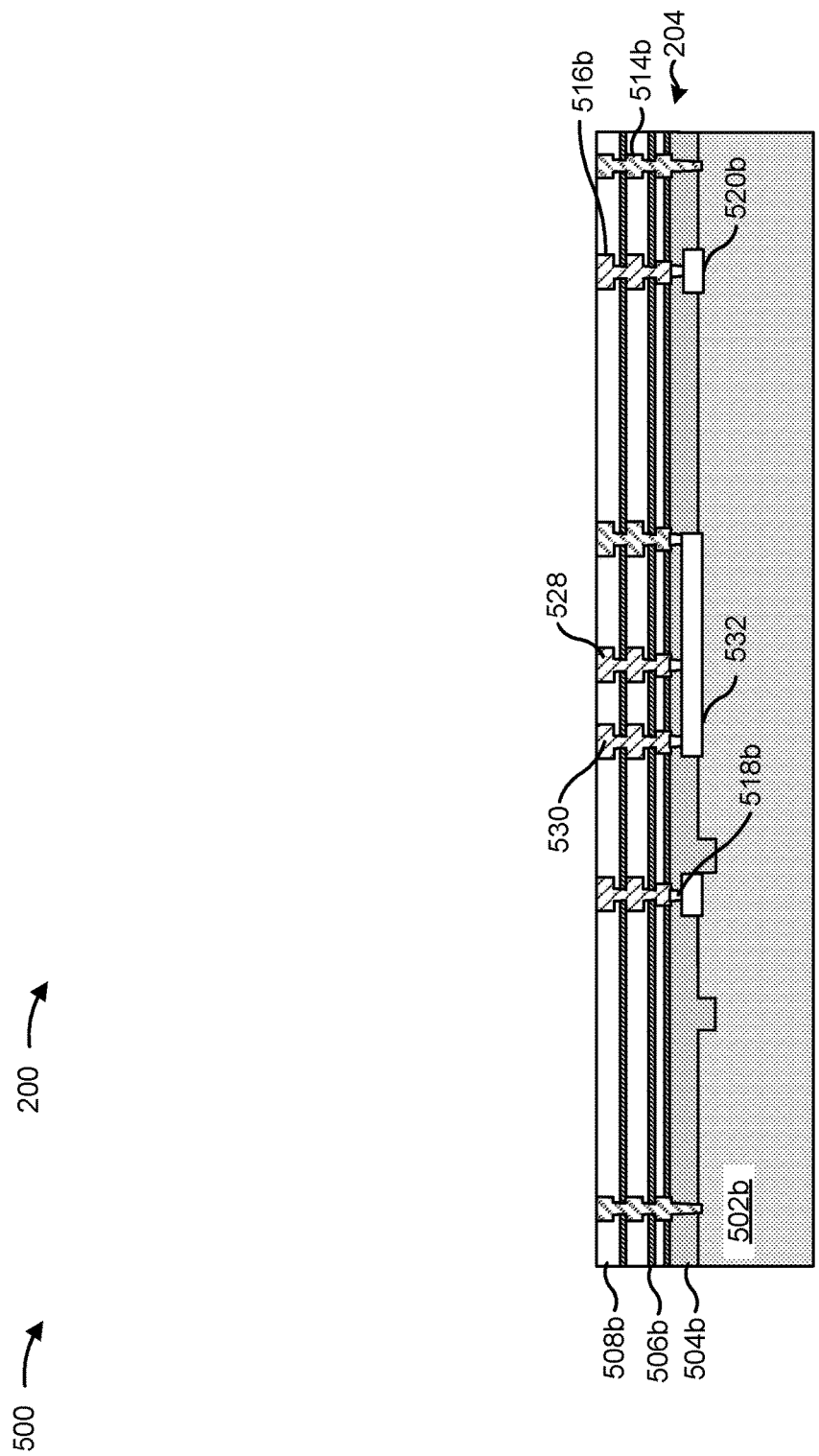

As shown in FIG. 5B, the deposition tool 102 deposits an FEOL ILD layer 504b over and/or on the substrate 502b. The deposition tool 102 also deposits alternating layers of ESLs 506b and dielectric layers 508b. The deposition tool 102, the exposure tool 104, the developer tool 106, and the etch tool 108 performs various operations to form contacts 518b, portions of seal rings 514b, circuits 516b, a test circuit 528, and a control circuit 530.

Figure 5C:
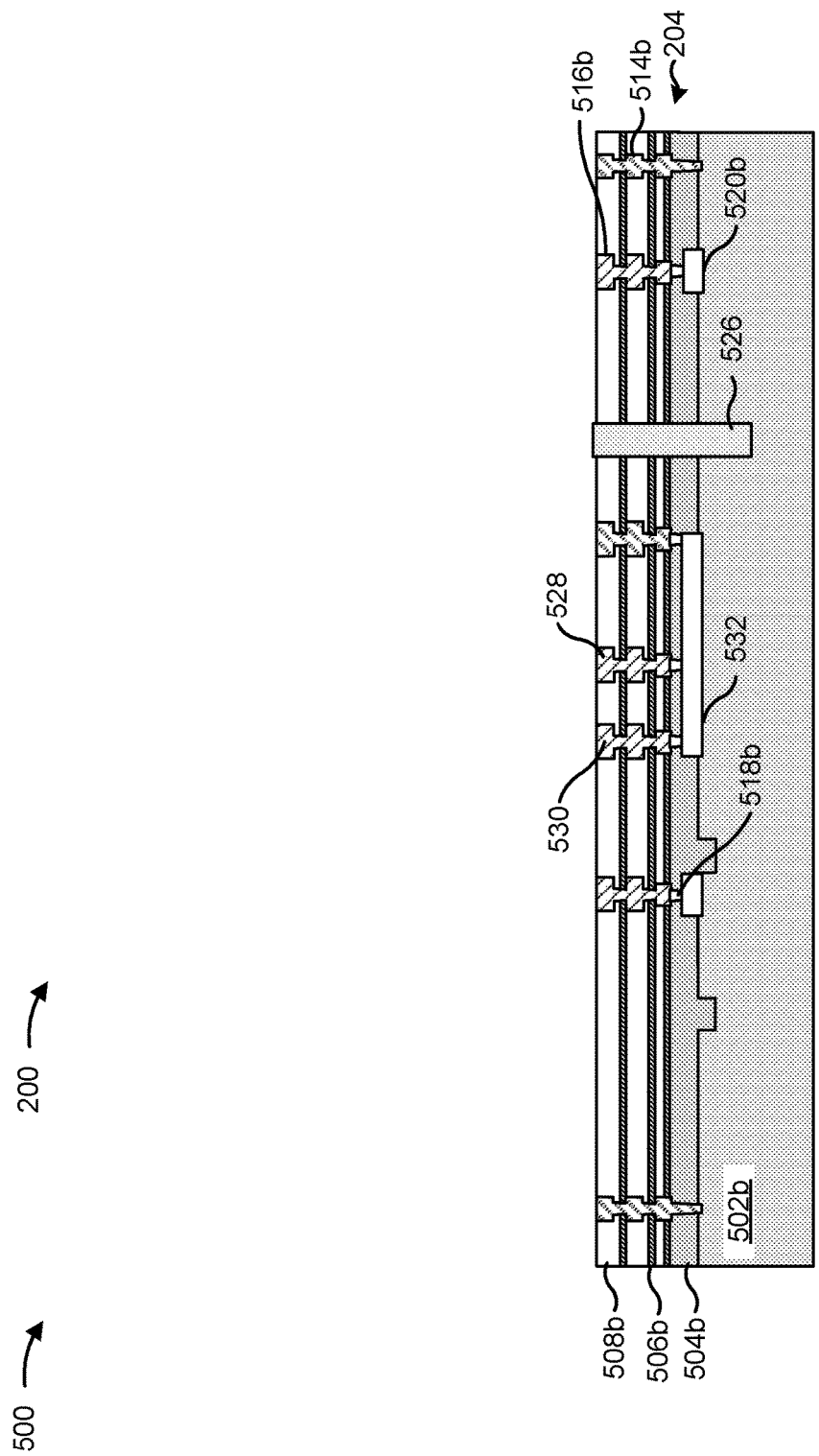

As shown in FIG. 5C, a die-to-die interconnect 526 is formed in portions of the substrate 502b, the FEOL ILD layer 504b, and the alternating layers of ESLs 506b and dielectric layers 508b. In some implementations, a pattern in a photoresist layer is used to form the die-to-die interconnect 526. In these implementations, the deposition tool 102 forms the photoresist layer on the top dielectric layer 508b. The exposure tool 104 exposes the photoresist layer to a radiation source to pattern the photoresist layer. The developer tool 106 develops and removes portions of the photoresist layer to expose the pattern. The etch tool 108 etches through the alternating layers of ESLs 506b and dielectric layers 508b, through the FEOL ILD layer 504b, and into a portion of the substrate 502b to form an opening or recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the opening or recess based on a pattern. The deposition tool 102 and/or the plating tool 112 may fill the opening or recess with a conductive material to form the die-to-die interconnect 526.

Figure 5D:
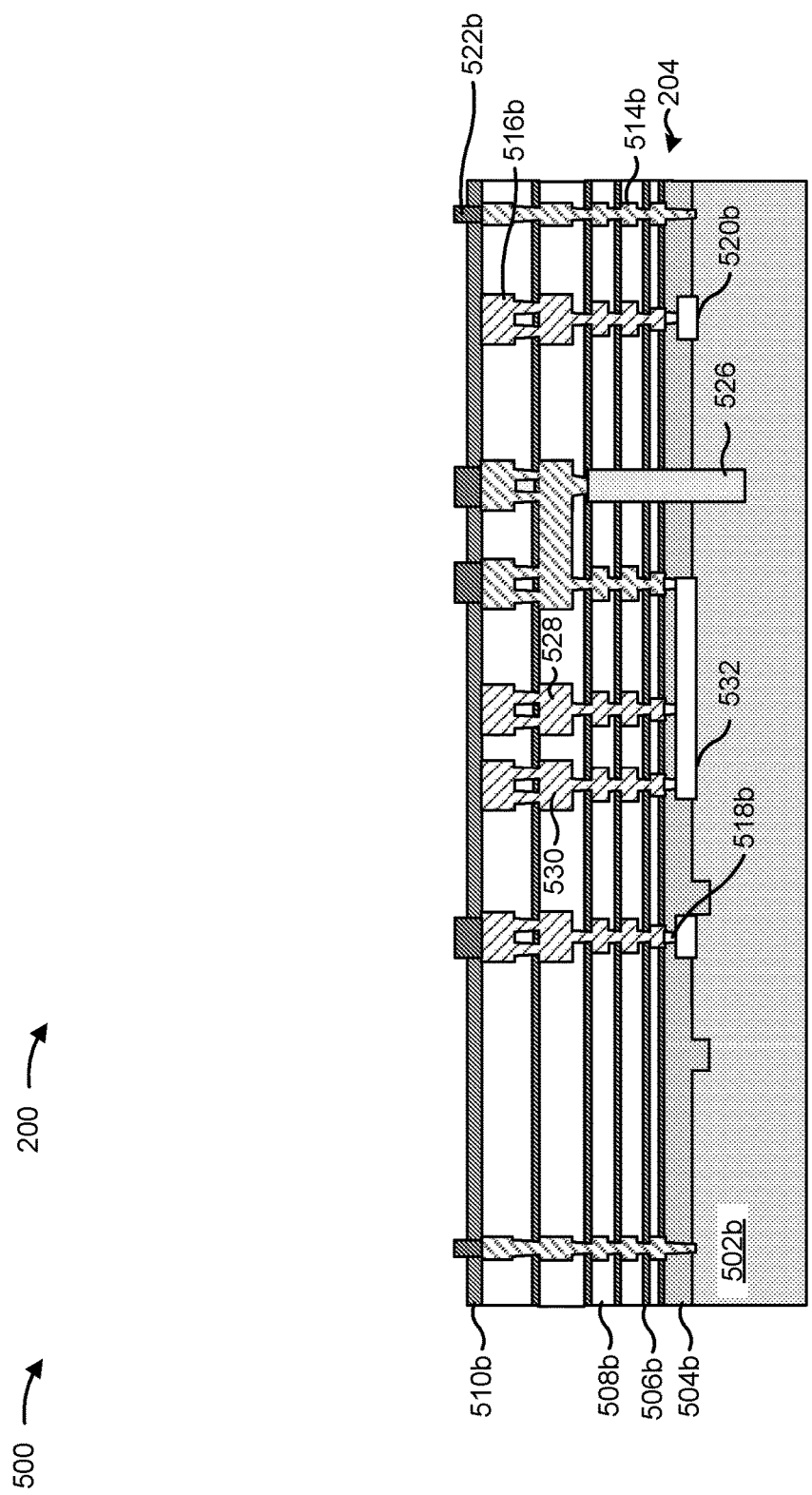

As shown in FIG. 5D, one or more of the semiconductor processing tools 102-112 form additional alternating layers of ESLs 506b and dielectric layers 508b, additional portions of the seal rings 514b, additional portions of the circuits 516b, additional portions of the test circuit 528, and additional portions of the control circuit 530. Moreover, the deposition tool 102 and/or the plating tool 112 forms a passivation layer 510b over and/or on the top dielectric layer 508b, and metal pads 522b over and/or on the seal rings 514b and the circuits 516b.

Figure 5E:
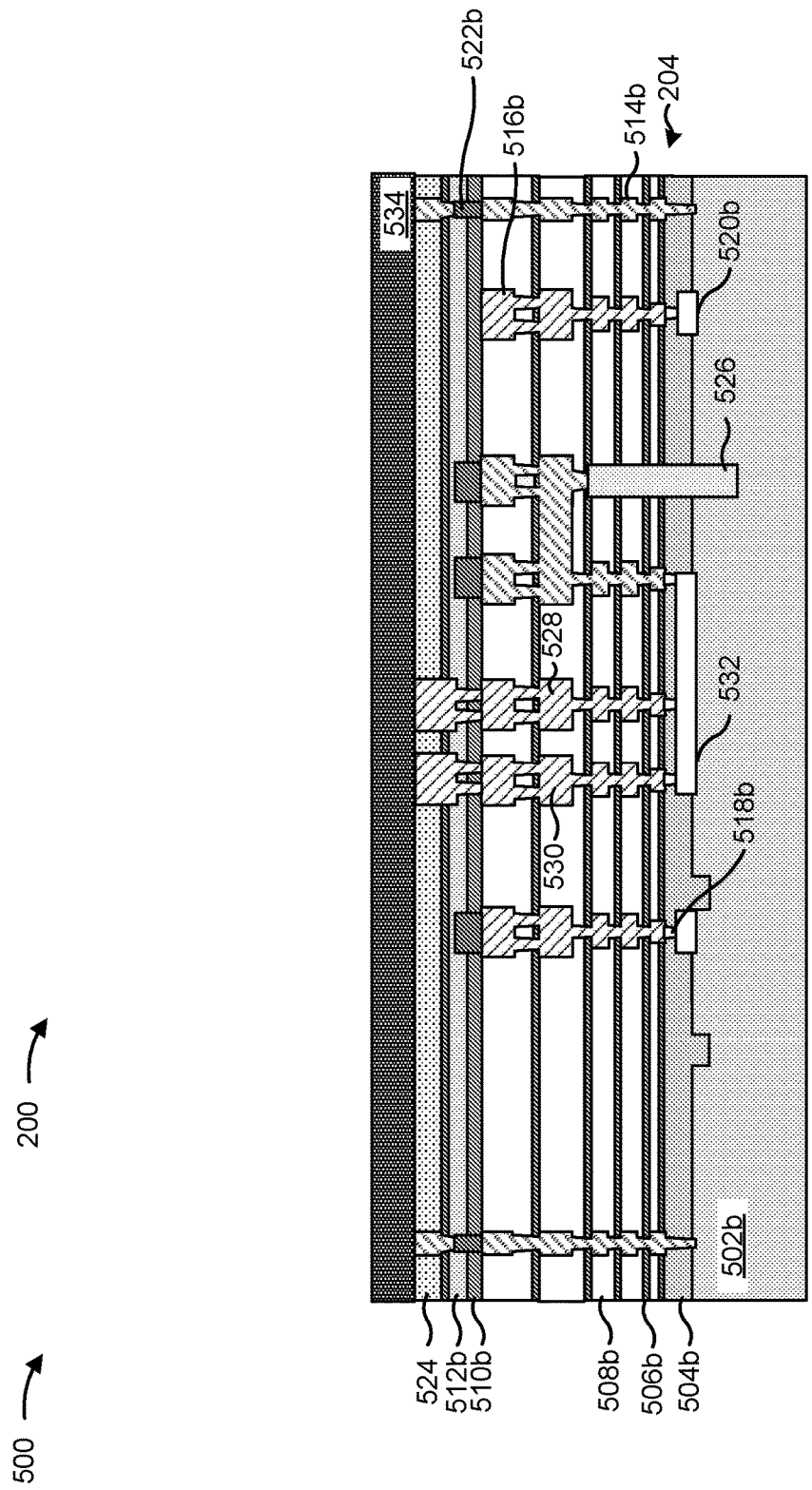

As shown in FIG. 5E, one or more of the semiconductor processing tools 102-112 form additional portions of the seal rings 514b, additional portions of the test circuit 528, and additional portions of the control circuit 530. Moreover, the deposition tool 102 forms a gap fill dielectric layer 512b over and/or on the passivation layer 510b, an ESL 506b over and/or on the passivation layer 510b, and a plurality of bonding layers 524 and 534 over and/or on the ESL 506b. The bonding layer 524 may include a hybrid bonding layer or another type of bonding layer. The bonding layer 534 may include a fusion bonding layer or another type of bonding layer. The bonding layers 524 and 534 include one or more types of materials such as a silicon oxide ($SiO_x$) (e.g., silicon dioxide ($SiO_2$)) and/or another type of bonding material.

Figure 5F:
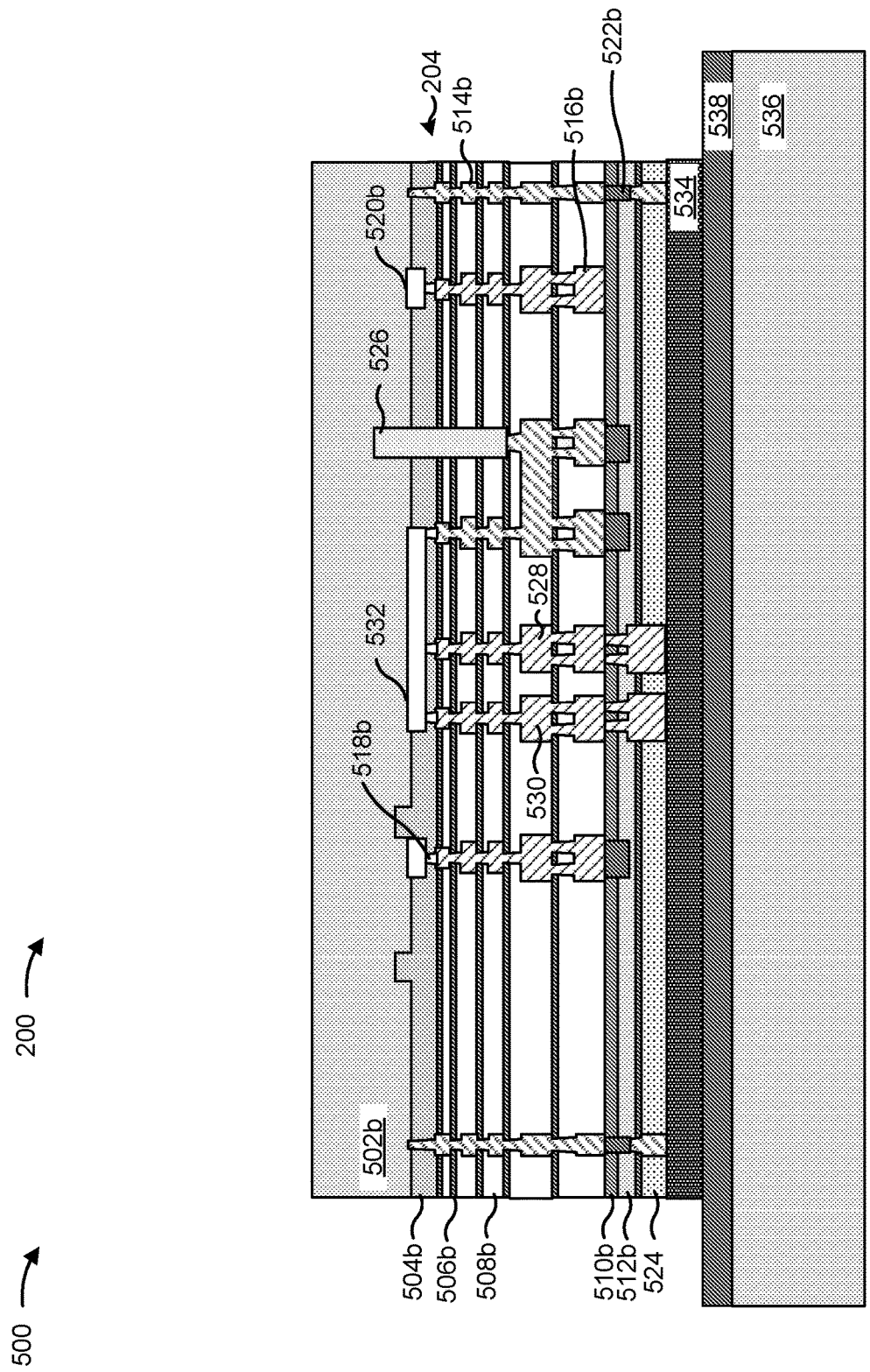

As shown in FIG. 5F, the die 204 is bonded to a carrier substrate 536 using the bonding layers 524 and 534. Accordingly, the die 204 may be flipped or rotated 180 degrees to bond the die 204 to the carrier substrate 536. Moreover, a bonding layer 538 (e.g., a fusion bonding layer or another type of bonding layer) included on the carrier substrate 536 is used to bond the die 204 and the carrier substrate 536. The die 204 and the carrier substrate 536 are bonded by a fusion bonding technique, a hybrid bonding technique, and/or another bonding technique.

Figure 5G:
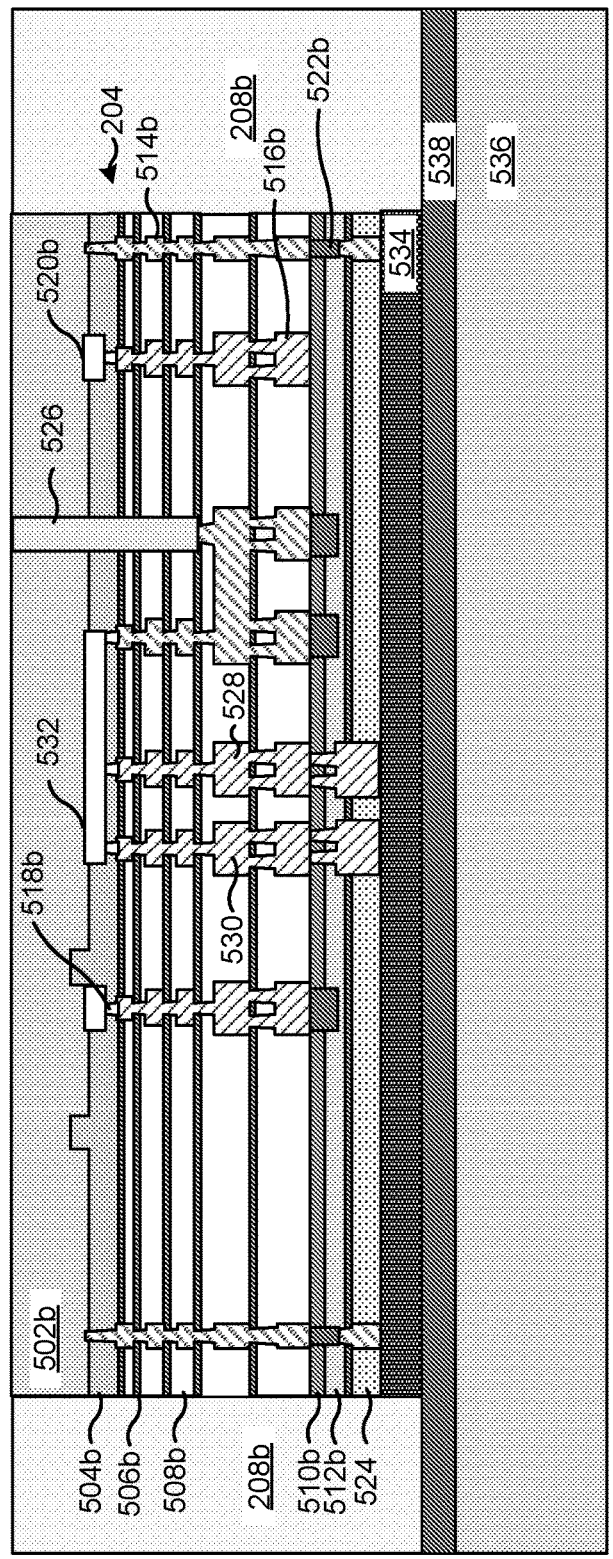

As shown in FIG. 5G, areas above the carrier substrate 536 around the die 204 are filled with the dielectric layer 208b. In particular, the deposition tool 102 deposits the dielectric layer 208b over portions of the carrier substrate 536 around the die 204.

Figure 5H:
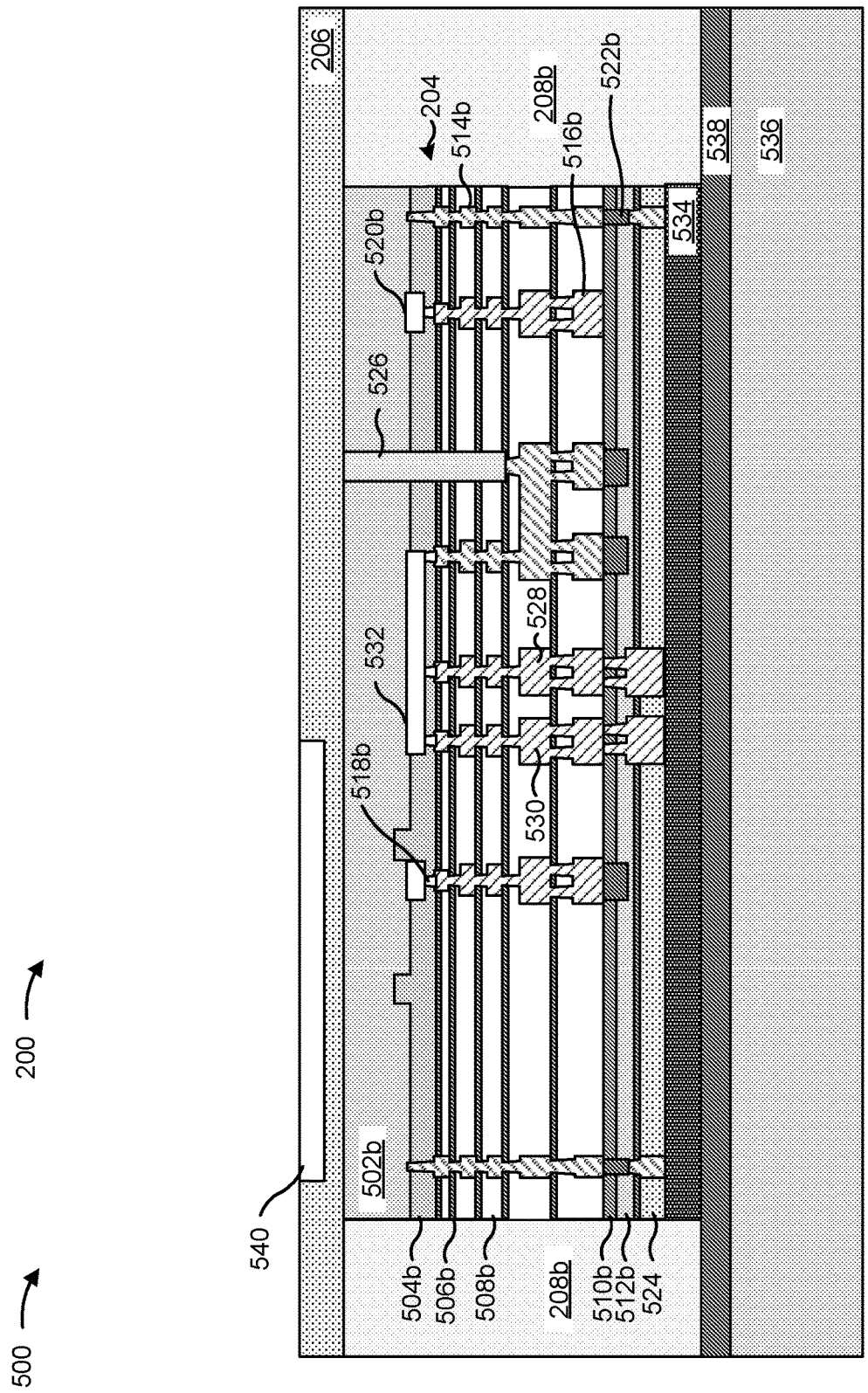

As shown in FIG. 5H, the bonding layer 206 is formed over and/or on the die 204. The deposition tool 102 may deposit the bonding layer 206 over and/or on the die 204 and over and/or on the dielectric layer 208b.

As further shown in FIG. 5H, a bonding layer test line 540 is formed in and/or on the bonding layer 206. Moreover, portions of the bonding layer test line 540 may be formed in the die 204. The bonding layer test line 540 is configured to enable independent testing of the die 202 and the die 204 after the die 202 and the die 204 are bonded. The bonding layer test line 540 may be used to test the bonding performance of the bond between the die 202 and the die 204, as well as various electrical properties of the die 202 and/or the die 204. In some implementations, the bonding layer test line 540 is formed to be connected to one or more circuits 516b and/or one or more metal pads 522b of the die 204.

As shown in FIG. 5I, a bonding layer test line 540 may include various components, including a plurality of test pads 542 (e.g., a test pad 542a, a test pad 542b), a plurality of bonding pad metallization layers 544 (e.g., a bonding pad metallization layer 544a, a bonding pad metallization layer 544b), and/or a plurality of bonding pad vias 546 (e.g., a bonding pad via 546a, a bonding pad via 546b), among other examples. The test pads 542a and 542b, the bonding pad metallization layers 544a and 544b, and the bonding pad vias 546a and 546b include a conductive material such as tungsten (W), cobalt (Co), ruthenium (Ru), titanium (Ti), aluminum (Al), copper (Cu), gold (Au), and/or a combination thereof, among other examples of conductive materials.

The test pads 542a and 542b include conductive structures that are configured to receive electrical inputs (e.g., from testing devices, from control devices) for testing the die 202 and/or the die 204. The electrical inputs include control inputs, test inputs, and/or other types of inputs. The bonding pad metallization layers 544a and 544b include elongated conductive structures that are configured to propagate the electrical inputs horizontally along a particular layer of the die 202 and/or the die 204. The bonding pad vias 546a and 546b include vias or interconnects that extend vertically into the die 202 and/or the die 204. The bonding pad vias 546a and 546b are configured to propagate the electrical inputs vertically between layers of the die 202 and/or the die 204. The bonding pad vias 546a and 546b are electrically connected to a metal pad 548, which may include a metal pad 522a or 522b, a circuit 516a or 516b, or another conductive structure in the die 202 or the die 204.

In some implementations, the test pad 542a, the bonding pad metallization layer 544a, and the bonding pad via 546a are configured to provide control inputs to the die 202 and/or the die 204 for electrically isolating the die 202 and the die 204 for independent testing of the die 202 and the die 204 after the die 202 and the die 204 are bonded. In some implementations, the test pad 542b, the bonding pad metallization layer 544b, and the bonding pad via 546b are configured to provide test inputs to the die 202 and/or the die 204 for testing the die 202 or the die 204.

Figure 5J:
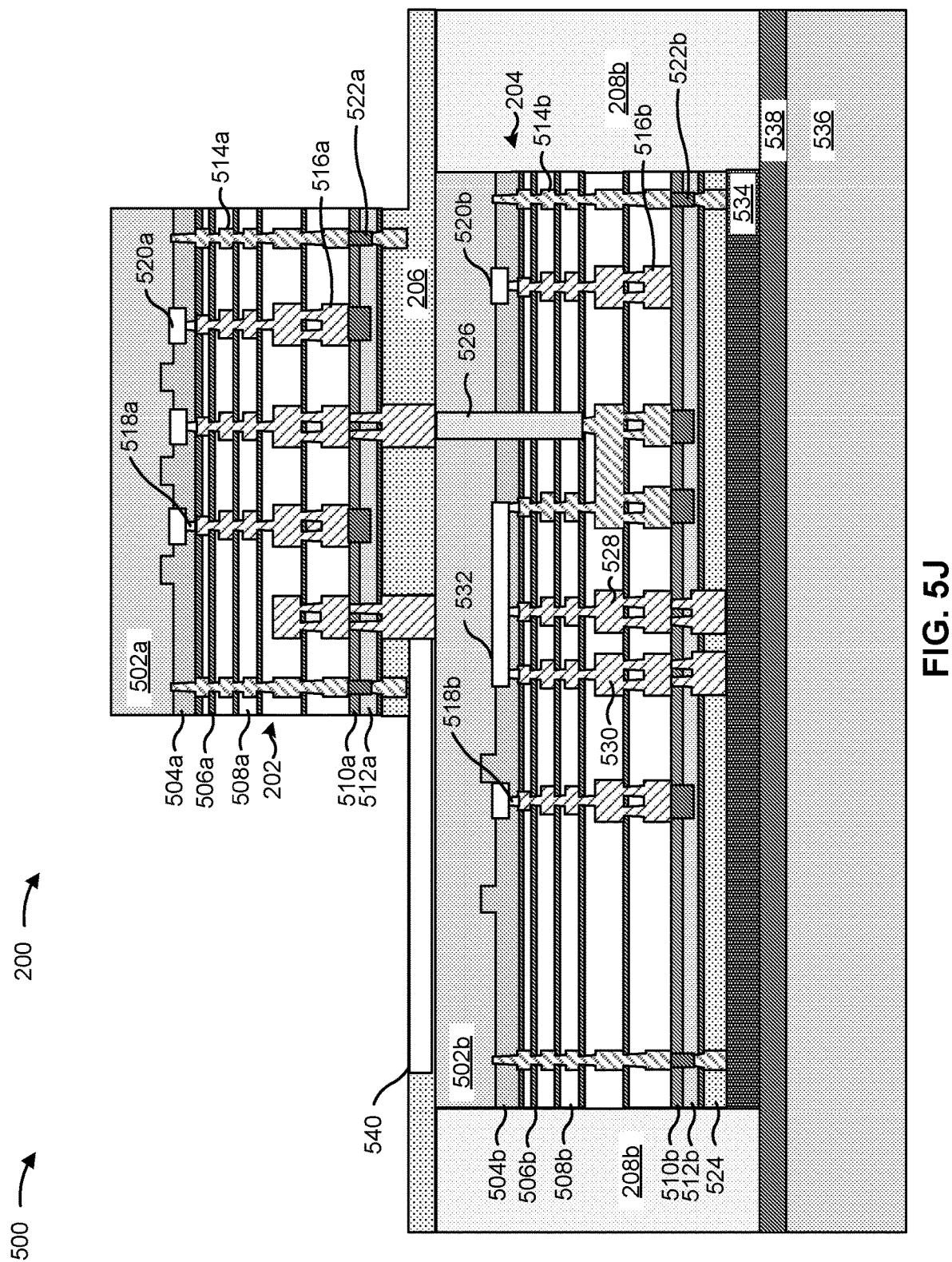

As shown in FIG. 5J, the die 202 and the die 204 are bonded using the bonding layer 206 (and, in some cases, another bonding layer on the die 202). The die 202 and the die 204 are bonded by a fusion bonding technique, a hybrid bonding technique, and/or another bonding technique. In some implementations, the die 202 is formed by similar techniques and operations as described above in FIGS. 5A-5H to include a substrate 502a, an FEOL ILD layer 504a, a plurality of ESLs 506a, a plurality of dielectric layers 508a, a passivation layer 510a, a gap fill dielectric layer 512a, a plurality of seal rings 514a, a plurality of circuits 516a, a plurality of contacts 518a, a plurality of transistors 520a, and a plurality of metal pads 522a. In some implementations, one or more bonding layer test lines 540 (or portions thereof) are formed in the die 202.

Figure 5K:
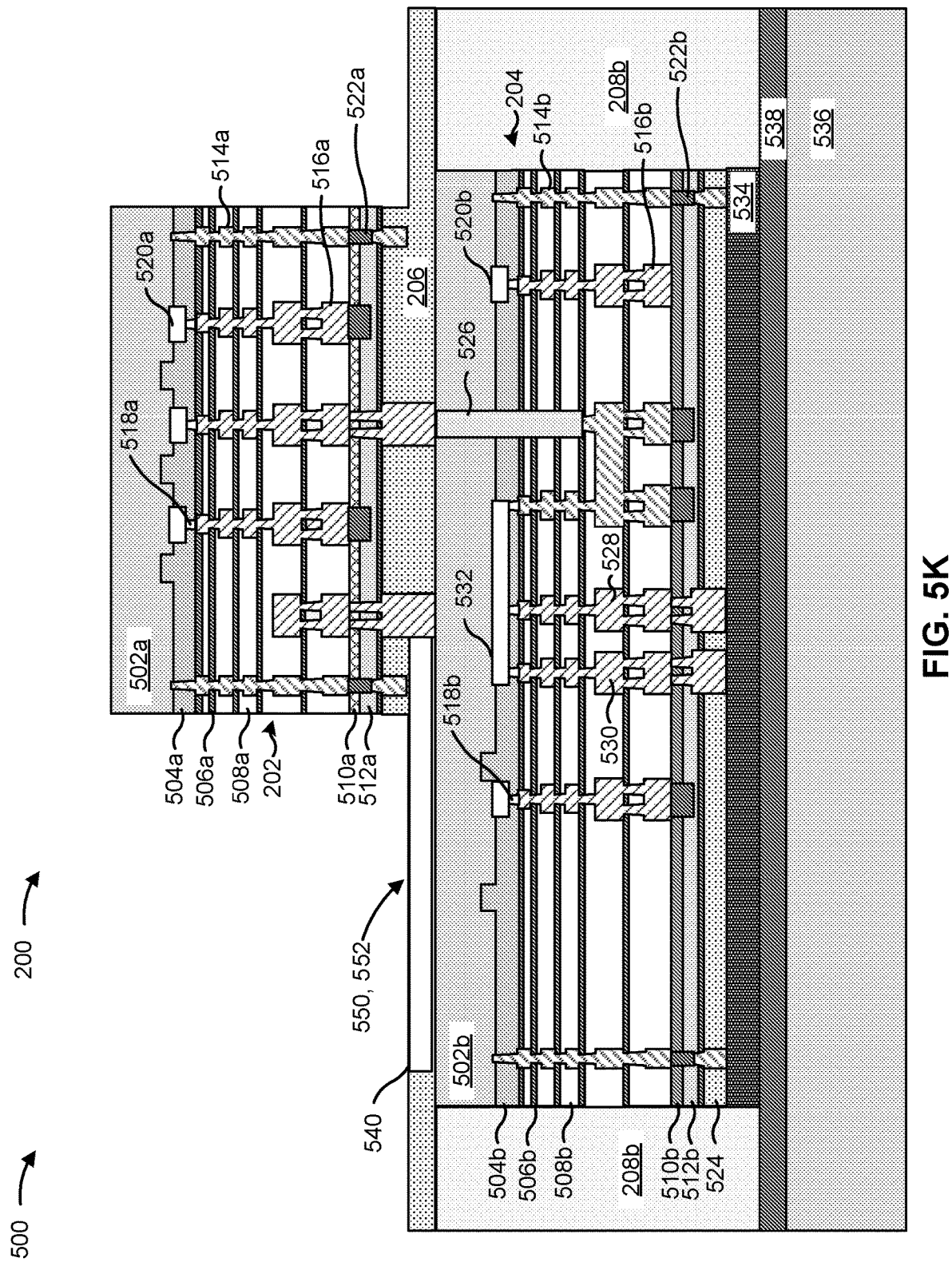

As shown in FIG. 5K, the bonding layer test line 540 is used to test the die 202 and the die 204 after bonding the die 202 and the die 204. The testing may include various types of tests including a bonding test, a continuity test, a resistance test, a current test, a voltage test, a CP test, a WAT, and/or another type of test. The bonding test may be performed to test the bonding performance of the bond between the die 202 and the die 204. The bonding test may test for voids in the bonding interface between the die 202 and the die 204, may test for continuity, and/or may test other parameters and attributes.

To perform a test using the bonding layer test line 540, a control input 550 (e.g., a control signal, a voltage, a current) is provided to or omitted from a test pad 542 to cause an associated transistor 532 to block a die-to-die interconnect 526 between the die 202 and the die 204. In this way, the die 202 and the die 204 are electrically isolated or disconnected such that the die 202 is independently tested while being electrically disconnected from the die 204. Test inputs 552 (e.g., test signals, voltages, currents) may be provided to another test pad 542 to perform the independent testing of the die 202. In some implementations, one or more testing devices and/or control devices (e.g., which may be implemented by one or more of the device 600 described in connection with FIG. 6 and/or one or more of the semiconductor processing tools 102-112) provide the control input and/or the test signals.

Figure 5L:
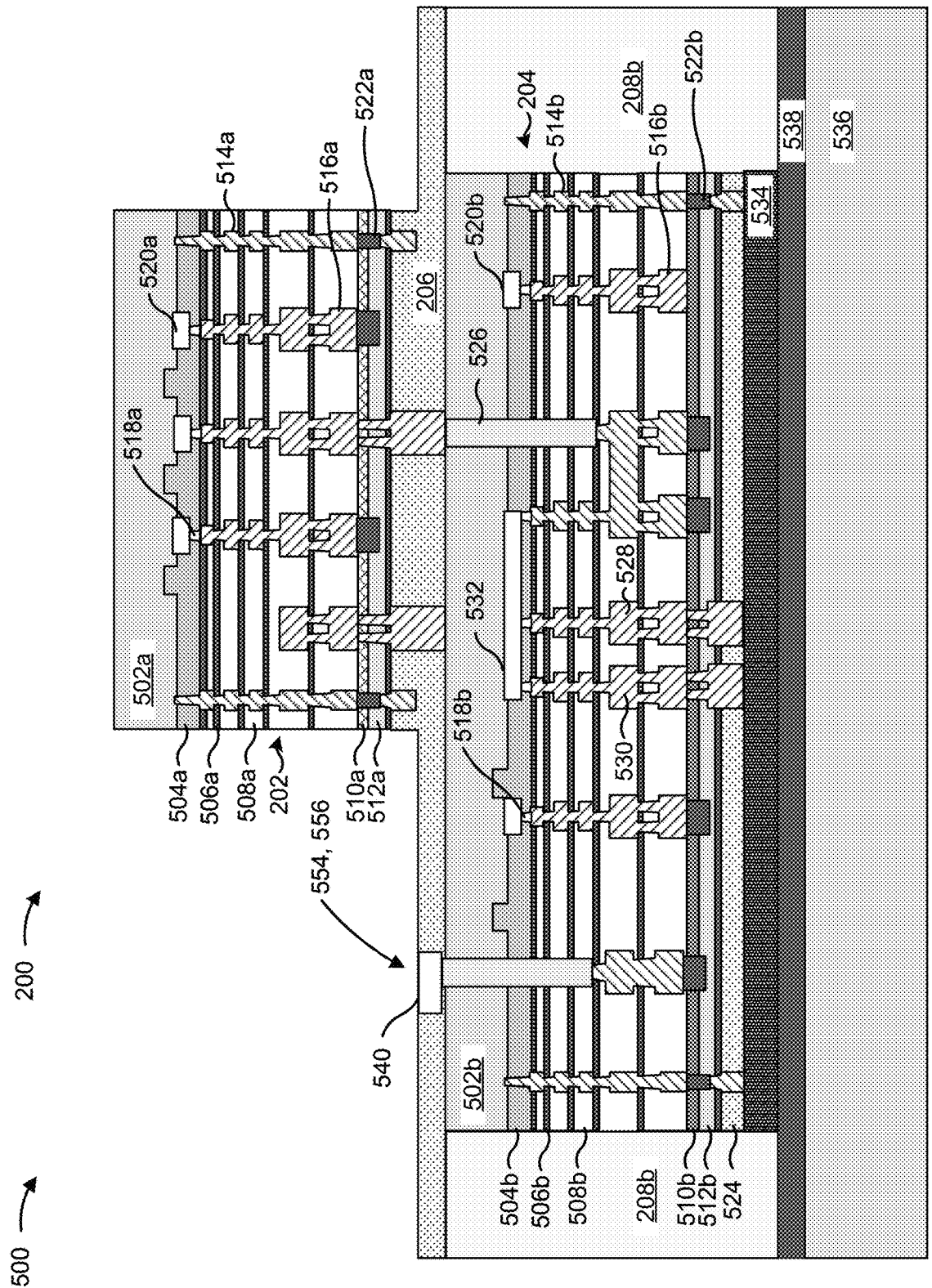

As shown in FIG. 5L, a control input 554 (e.g., a control signal, a voltage, a current) is provided to or omitted from a test pad 542 of another bonding layer test line 540 to cause an associated transistor 532 to block a die-to-die interconnect 526 between the die 202 and the die 204. In this way, the die 202 and the die 204 are electrically isolated or disconnected such that the die 204 is independently tested while being electrically disconnected from the die 202. Test inputs 556 (e.g., test signals, voltages, currents) may be provided to another test pad 542 to perform the independent testing of the die 204.

In some implementations, the order of testing described above is reversed such that the die 202 is tested first and then the die 204 is tested. In some implementations, other testing orders are used. In some implementations, a plurality of bonding layer test lines 540 are included in the stacked semiconductor device 200 to block a plurality of die-to-die interconnects 526 of the stacked semiconductor device 200.

Figure 5M:
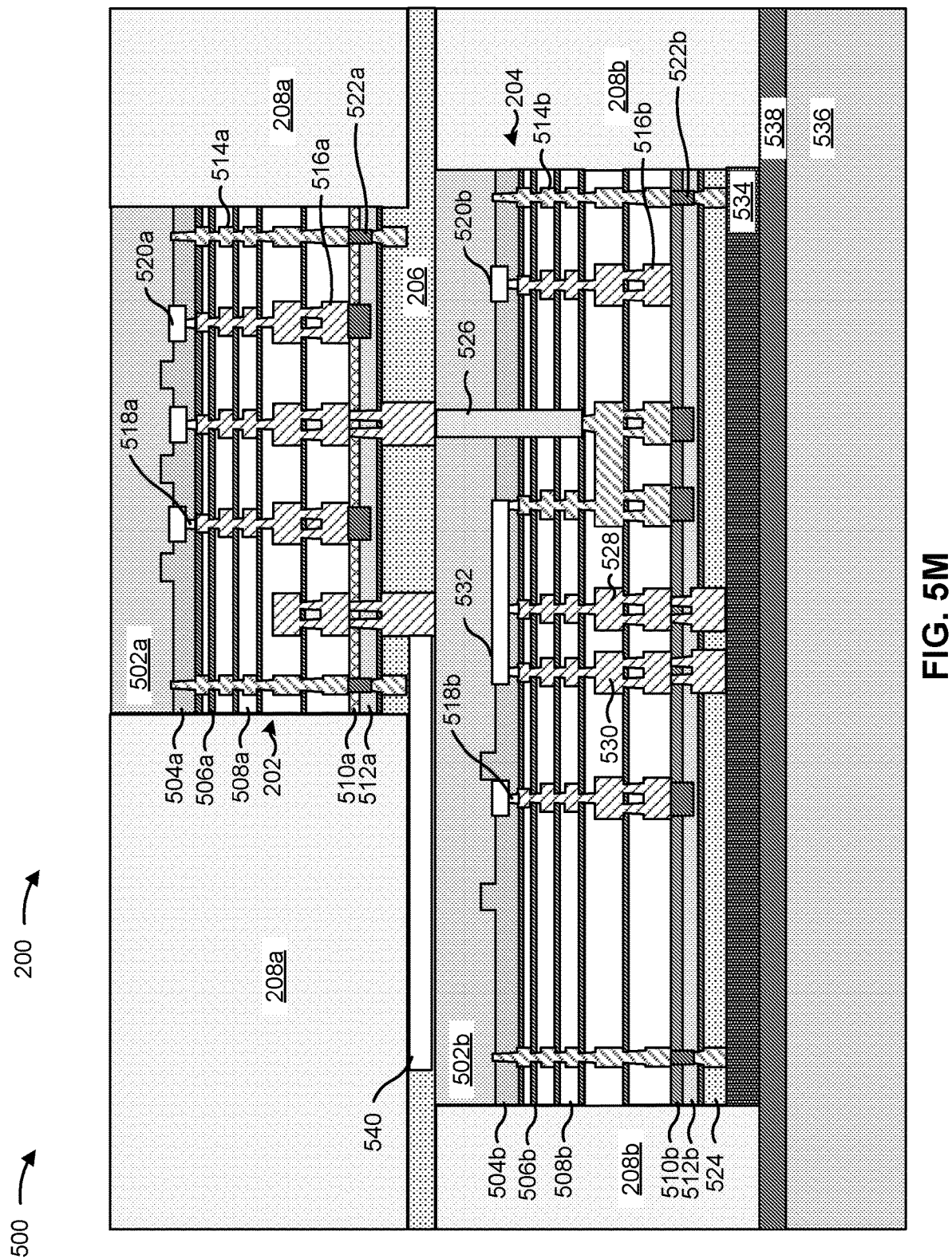

As shown in FIG. 5M, areas above the die 204 around the die 202 are filled with the dielectric layer 208a. The dielectric layer 208a includes and around-die dielectric layer. In particular, the deposition tool 102 deposits the dielectric layer 208a over portions of the die 204 around the die 202. The dielectric layer 208a covers the bonding layer test lines 540, the plurality of test pads 542 (e.g., the test pad 542a, the test pad 542b), the plurality of bonding pad metallization layers 544 (e.g., the bonding pad metallization layer 544a, the bonding pad metallization layer 544b, and/or the plurality of bonding pad vias 546 (e.g., the bonding pad via 546a, the bonding pad via 546b). Thus, the bonding layer test lines 540, the plurality of test pads 542 (e.g., the test pad 542a, the test pad 542b), the plurality of bonding pad metallization layers 544 (e.g., the bonding pad metallization layer 544a, the bonding pad metallization layer 544b, and/or the plurality of bonding pad vias 546 (e.g., the bonding pad via 546a, the bonding pad via 546b) are on a portion of the die 204 and are under an around-die dielectric layer (e.g., the dielectric layer 208a) that surrounds the die 202.

In some implementations, the dielectric layer 208a includes a molding compound such as an insulating material (e.g., a polymer, a molding underfill material, or other insulators, as examples). In some implementations, the dielectric layer 208a includes a nonconductive or dielectric material, such as an epoxy, a resin, a moldable polymer such as PBO, or another moldable material. For example, molding compound may include an epoxy or resin that is cured through a chemical reaction or by drying. In another implementation, the molding compound is an ultraviolet (UV) cured polymer.

Figure 5N:
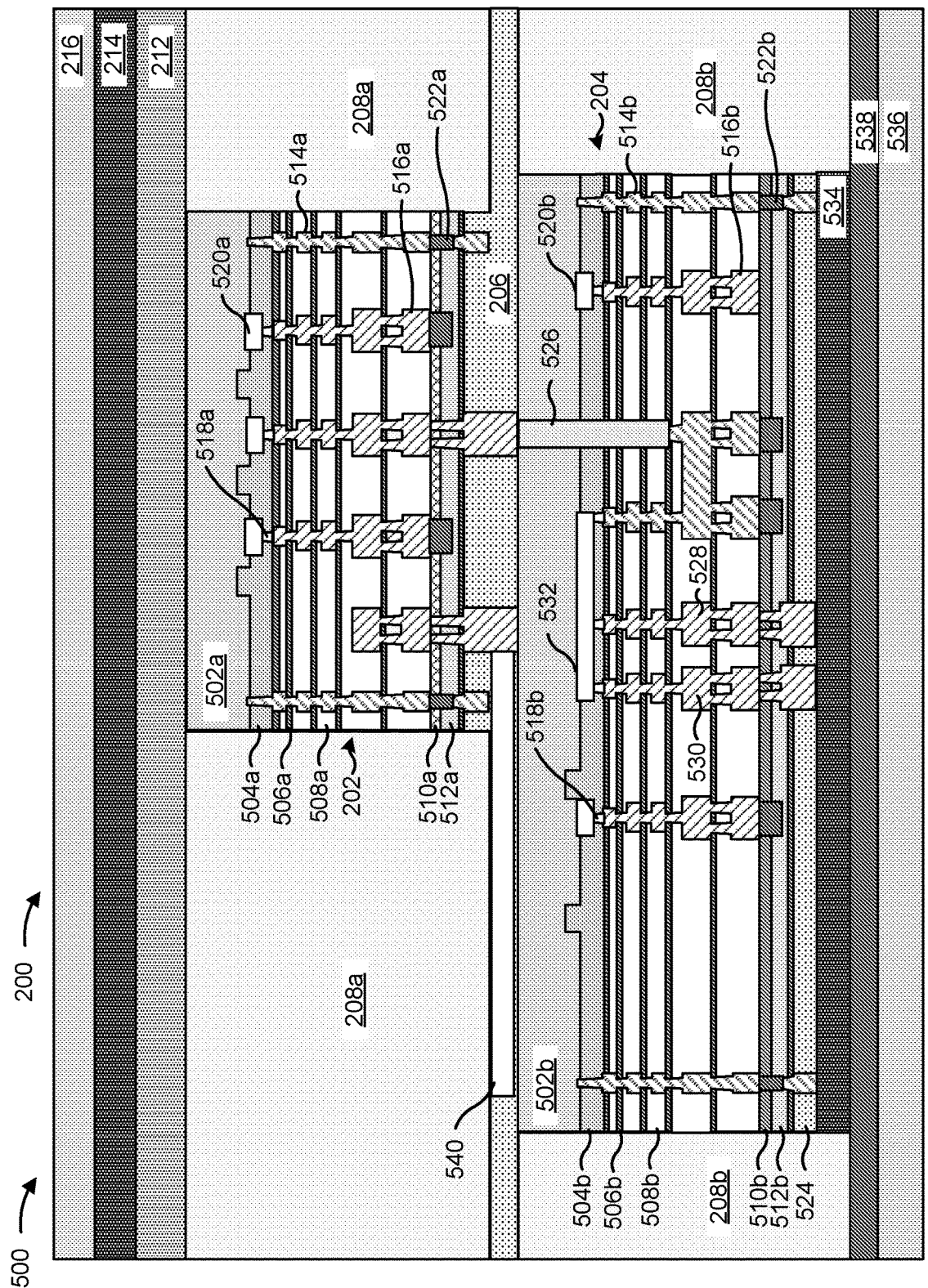

As shown in FIG. 5N, the stacked semiconductor device 200 is bonded to the carrier substrate 216. The deposition tool 102 deposits the bonding layer 212 over and/or on the die 202 and over and/or the dielectric layer 208a, and deposits the bonding layer 214 over and/or on the carrier substrate 216. The bonding layers 212 and 214 are then used to bond the stacked semiconductor device 200 and the carrier substrate 216.

Figure 5O:
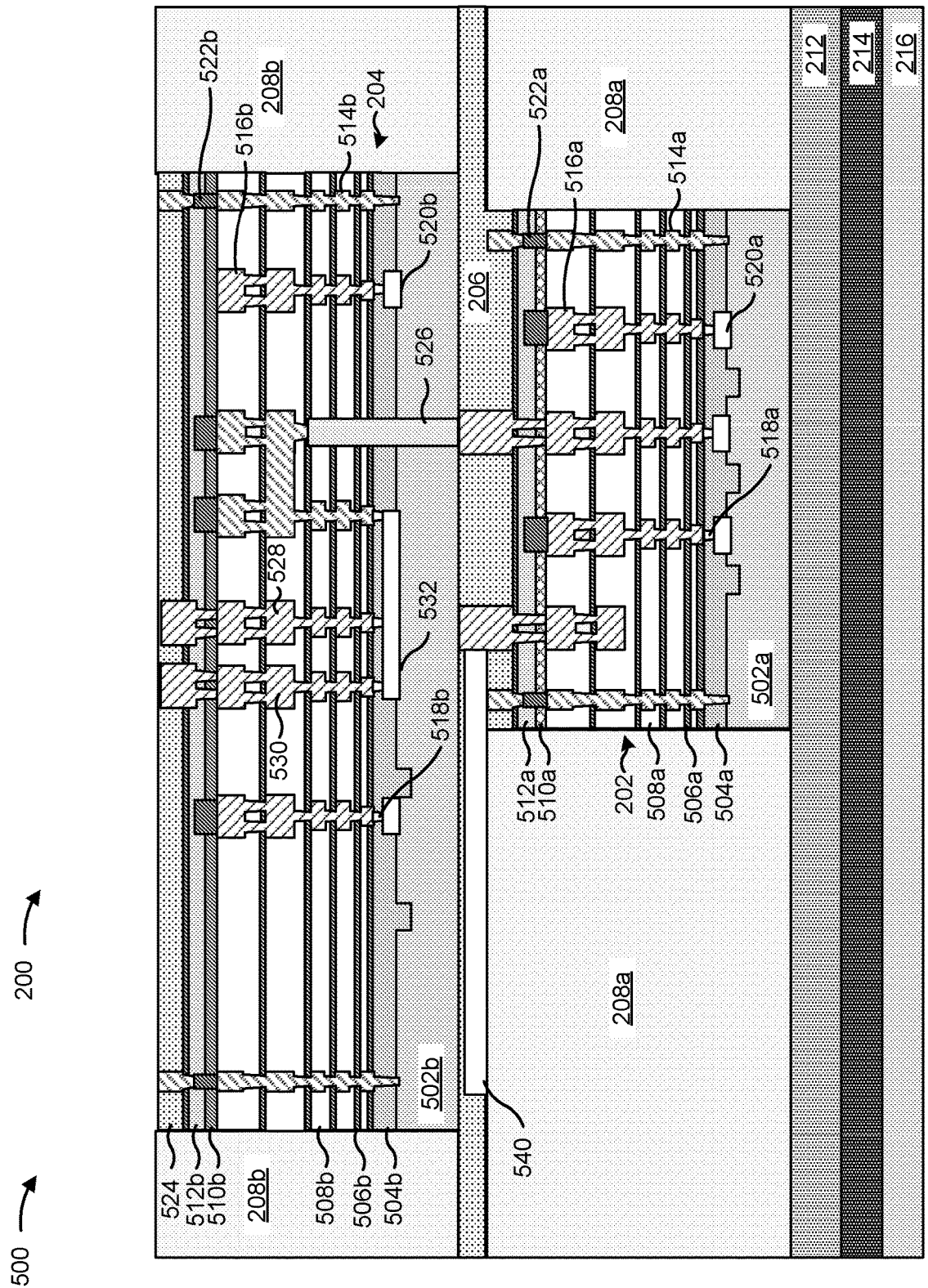

As shown in FIG. 5O, the stacked semiconductor device 200 is flipped and one or more operations are performed to remove the carrier substrate 536 and the bonding layers 534 and 538 from the stacked semiconductor device 200. In some implementations, the carrier substrate 536 is de-bonded from the stacked semiconductor device 200 by a thermal operation to alter the adhesive properties of the bonding layers 534 and 538. An energy source such as an ultraviolet (UV) laser, a carbon dioxide ($CO_2$) laser, or an infrared (IR) laser, among other examples, is utilized to irradiate and heat the bonding layers 534 and 538 until the adhesive properties of the bonding layer 534 and/or 538 are reduced. Then, the carrier substrate 536 and the bonding layers 534 and 538 are physically separated and removed from the stacked semiconductor device 200.

Figure 5P:
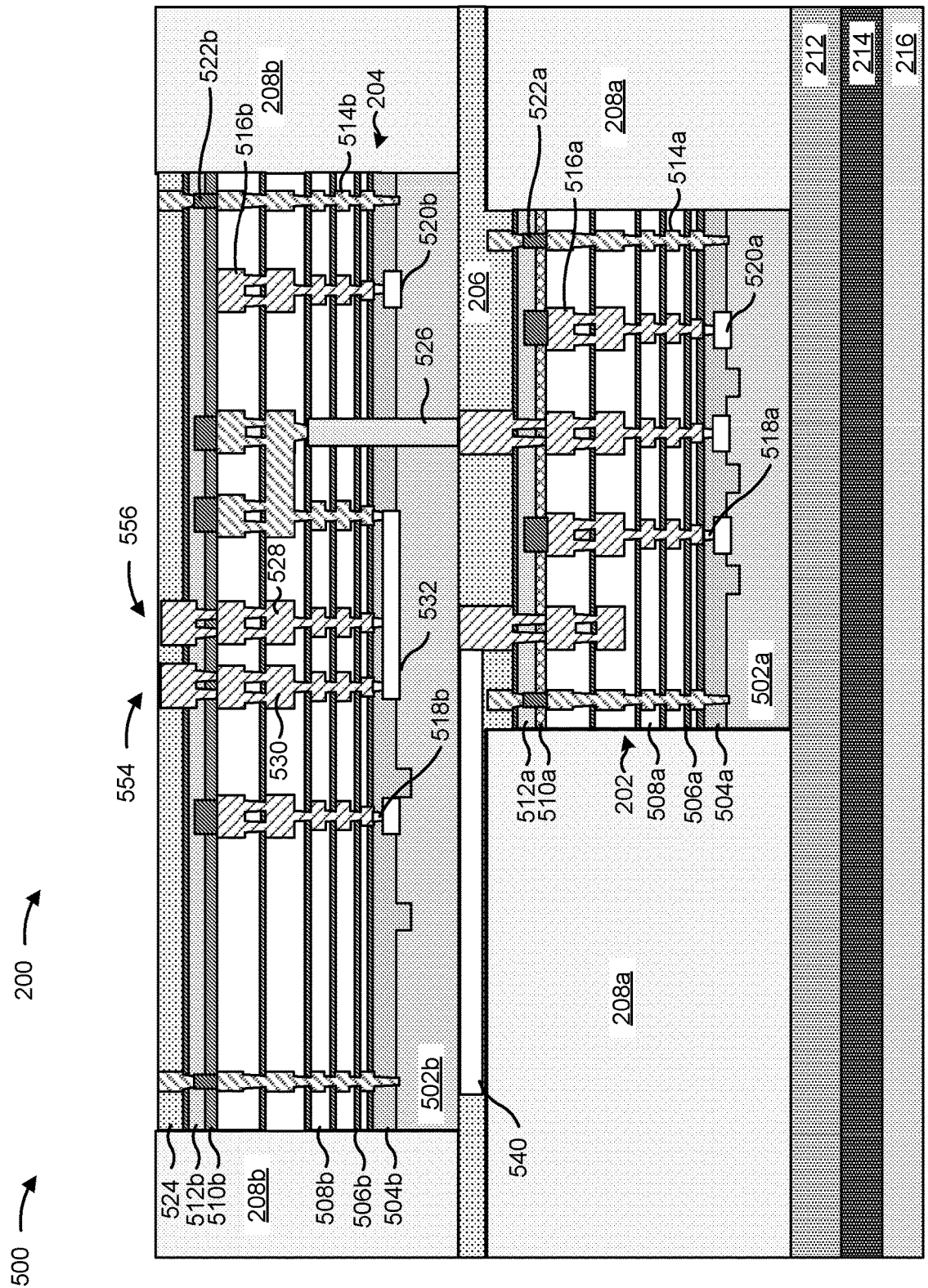

As shown in FIG. 5P, independent testing of the die 202 and the die 204 is performed using the test circuits 528 and the control circuits 530. As an example, a control input (e.g., a control signal, a voltage, a current) is provided to or omitted from a control circuit 530 to cause an associated transistor 532 to block a die-to-die interconnect 526 between the die 202 and the die 204. In this way, the die 202 and the die 204 are electrically isolated or disconnected such that the die 204 is independently tested while being electrically disconnected from the die 202. Test inputs (e.g., test signals, voltages, currents) may be provided to a test circuit 528 to perform the independent testing of the die 204. In some implementations, one or more testing devices and/or control devices (e.g., which may be implemented by one or more of the device 600 described in connection with FIG. 6 and/or one or more of the semiconductor processing tools 102-112) provide the control input and/or the test signals. In some implementations, a plurality of control circuits 530 and a plurality of transistors 532 are included in the stacked semiconductor device 200 to block a plurality of die-to-die interconnects 526 of the stacked semiconductor device 200.

The control input is then reversed to cause the transistor 532 to electrically connect the die 202 and the die 204 through the die-to-die interconnect 526. In this way, the die 202 and the die 204 are electrically connected such that the die 202 can be tested through the test circuit 528. Moreover, a control input (e.g., a control signal, a voltage, a current) is provided to or omitted from another control circuit 530 to cause another transistor 532 to block the circuits 516b and the transistors 520b of the die 204. In this way, the die 202 is independently tested while being electrically isolated from the circuits 516b and the transistors 520b of the die 204. Test inputs (e.g., test signals, voltages, currents) may be provided to the test circuit 528 to perform the independent testing of the die 204. In some implementations, a plurality of control circuits 530 and a plurality of transistors 532 are included in the stacked semiconductor device 200 to block a plurality of circuits 516b and transistors 520b of the die 204.

In some implementations, the order of testing described above is reversed such that the die 202 is tested first and then the die 204 is tested. In some implementations, other testing orders are used.

As shown in FIG. 5Q, the passivation layer 218 and the bonding layer 210 are formed (e.g., by the deposition tool 102) on the die 204. The solder balls 220 are also attached to the stacked semiconductor device 200.

As indicated above, FIGS. 5A-5Q are provided as examples. Other examples may differ from what is described with regard to FIGS. 5A-5Q.

Figure 6:
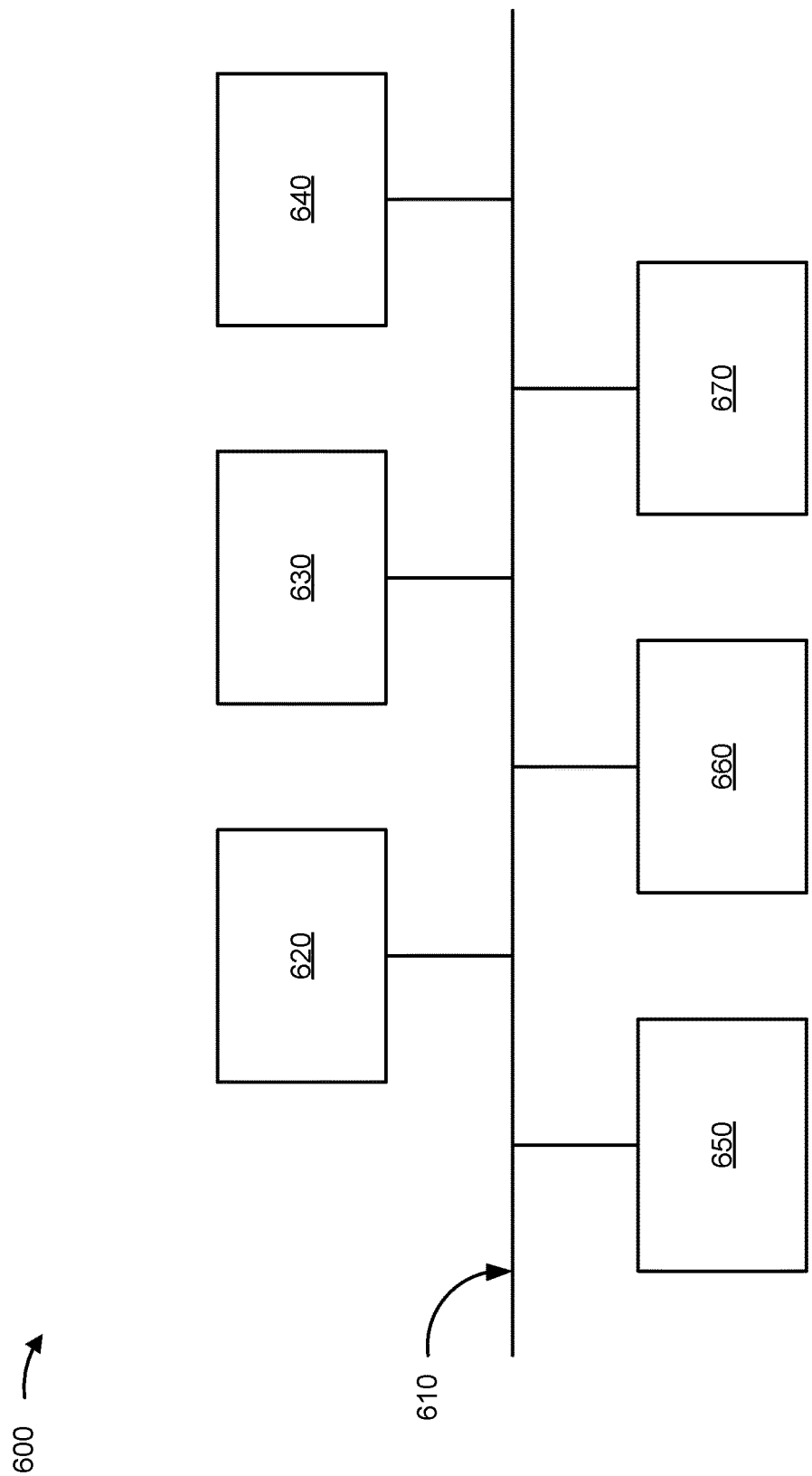
FIG. 6 is a diagram of example components of one or more devices of FIG. 1 described herein.

FIG. 6 is a diagram of example components of a device 600. In some implementations, one or more of the semiconductor processing tools 102-112 and/or the wafer/die transport tool 114 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
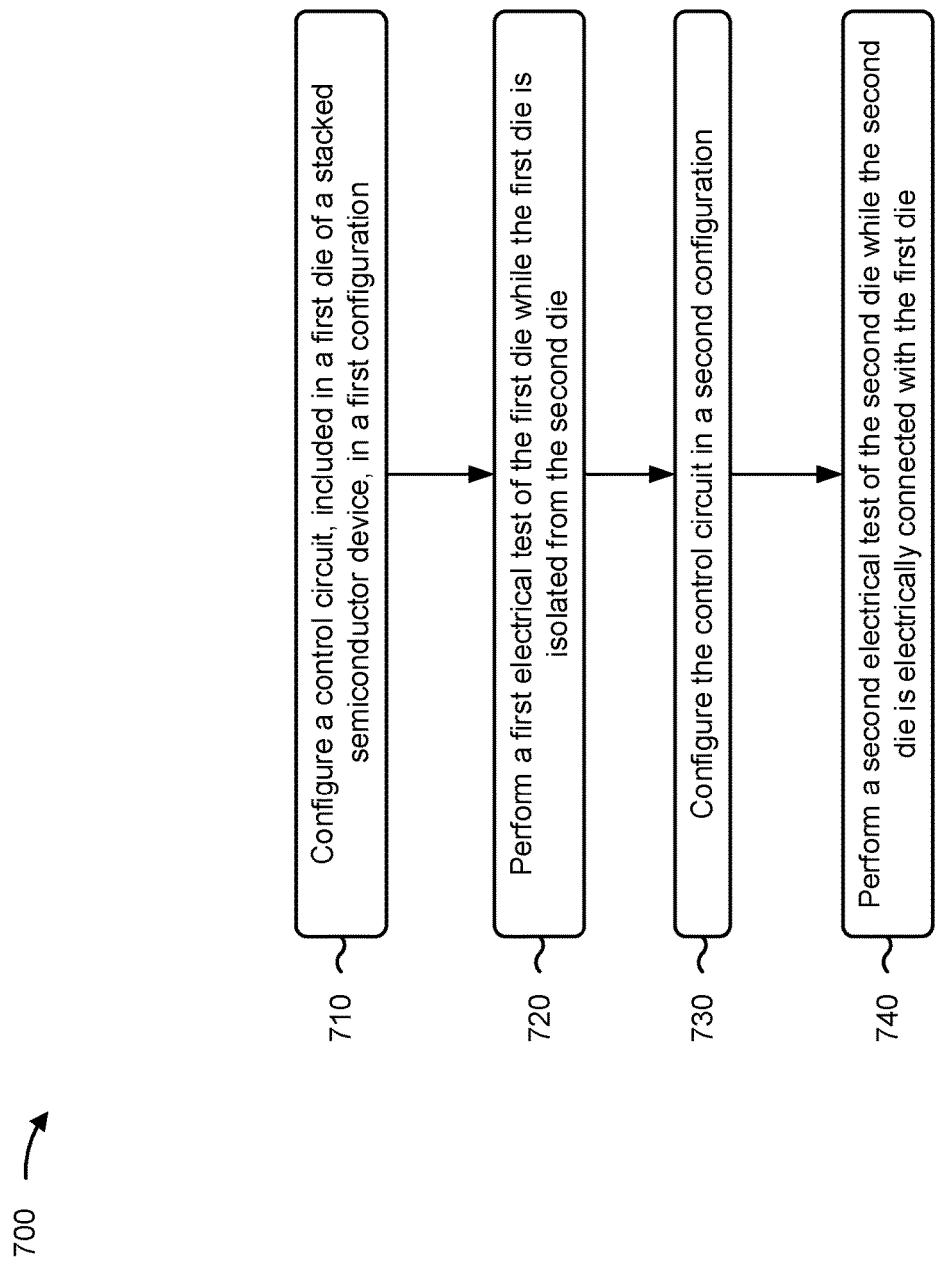
FIG. 7 is a flowchart of an example process relating to testing a stacked semiconductor device described herein.

FIG. 7 is a flowchart of an example process 700 associated with testing a stacked semiconductor device. In some implementations, one or more process blocks of FIG. 7 may be performed by a device (e.g., the device 600). In some implementations, one or more process blocks of FIG. 7 are performed by one or more semiconductor processing tools (e.g., one or more of the semiconductor processing tools 102-112). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include configuring a control circuit, included in a first die of a stacked semiconductor device, in a first configuration (block 710). For example, the device may configure a control circuit (e.g., the control circuit 330 and/or 530), included in a first die (e.g., the die 204) of the stacked semiconductor device 200, in a first configuration, as described above. In some implementations, the control circuit being in the first configuration causes a transistor (e.g., the transistor 332 and/or 532) in the first die to isolate the first die from a second die (e.g., the die 202) of the stacked semiconductor device 200.

As further shown in FIG. 7, process 700 may include performing a first electrical test of the first die while the first die is isolated from the second die (block 720). For example, the device may perform a first electrical test of the first die while the first die is isolated from the second die, as described above.

As further shown in FIG. 7, process 700 may include configuring the control circuit in a second configuration (block 730). For example, the device may configure the control circuit in a second configuration, as described above. In some implementations, the control circuit being in the second configuration causes the transistor to electrically connect the second die and the first die.

As further shown in FIG. 7, process 700 may include performing a second electrical test of the second die while the second die is electrically connected with the first die (block 740). For example, the device may perform a second electrical test of the second die while the second die is electrically connected with the first die, as described above.

Process 700 may include additional implementations, such as any single implementation or any combination of implementations described below and/or in connection with one or more other processes described elsewhere herein.

In a first implementation, process 700 includes configuring another control circuit (e.g., the control circuit 430 and/or another control circuit 530) in the first die such that another transistor (e.g., the transistor 432 and/or another transistor 532) in the first die isolates the second die from circuits of the first die, and wherein performing the second electrical test of the second die comprises performing the second electrical test of the second die while the second die is isolated from the circuits of the first die. In a second implementation, alone or in combination with the first implementation, process 700 includes providing a bonding layer test signal (e.g., the test input 552) to the first die through a first test pad (e.g., the test pad 542a) of a bonding layer test line (e.g., the bonding layer test line 540), and providing a control signal (e.g., the control input 550) through a second test pad (e.g., the test pad 542b) of the bonding layer test line to electrically isolate the first die and the second die while providing the bonding layer test signal.

In a third implementation, alone or in combination with one or more of the first and second implementations, process 700 includes providing another bonding layer test signal (e.g., the test input 556) to the second die through a first test pad (e.g., another test pad 542a) of another bonding layer test line (e.g., another bonding layer test line 540), and providing another control signal (e.g., the control input 554) through a second test pad (e.g., another test pad 542b) of the other bonding layer test line to electrically isolate the first die and the second die while providing the other bonding layer test signal. In a fourth implementation, alone or in combination with one or more of the first through third implementations, providing the bonding layer test signal and the other bonding layer test signal includes providing the bonding layer test signal and the other bonding layer test signal prior to performing the first electrical test and the second electrical test.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

FIG. 8 is a flowchart of an example process 800 associated with forming a stacked semiconductor device. In some implementations, one or more process blocks of FIG. 8 may be performed by one or more semiconductor processing tools (e.g., the one or more semiconductor processing tools 102-112). Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include forming a first plurality of circuits on a first substrate of a first die (block 810). For example, one or more of the semiconductor processing tools 102-112 may form a first plurality of circuits (e.g., the circuits 316b, 416b, and/or 516b) on a first substrate (e.g., the substrate 302b, 402b, and/or 502b) of a first die (e.g., the die 204), as described above. In some implementations, the first plurality of circuits includes a plurality of circuit probe test circuits (e.g., circuit probe test circuits 328, 428, and/or 528), and a plurality of control circuits (e.g., the control circuits 330, 430, 530).

As further shown in FIG. 8, process 800 may include forming a second plurality of circuits on a second substrate of a second die (block 820). For example, one or more of the semiconductor processing tools 102-112 may form a second plurality of circuits (e.g., the circuits 316a, 416a, and/or 516a) on a second substrate (e.g., the substrate 302a, 402a, and/or 502a) of a second die (e.g., the die 202), as described above.

As further shown in FIG. 8, process 800 may include bonding the first die and the second die to form a stacked semiconductor device (block 830). For example, one or more of the semiconductor processing tools 102-112 may bond the first die and the second die to form the stacked semiconductor device 200, as described above.

As further shown in FIG. 8, process 800 may include performing, through the plurality of circuit probe test circuits and using the plurality of control circuits to selectively isolate the first die and the second die, independent circuit probe tests of a subset of the first plurality of circuits and a subset of the second plurality of circuits (block 840). For example, the device 600 may perform, through the plurality of circuit probe test circuits and using the plurality of control circuits to selectively isolate the first die and the second die, independent circuit probe tests of a subset of the first plurality of circuits and a subset of the second plurality of circuits, wherein the independent circuit probe tests are performed after bonding the first die and the second die, as described above. In some implementations, the independent circuit probe tests are performed after bonding the first die and the second die.

Process 800 may include additional implementations, such as any single implementation or any combination of implementations described below and/or in connection with one or more other processes described elsewhere herein.

In a first implementation, process 800 includes forming, prior to bonding the first die and the second die, a plurality of bonding layer test lines 540, and performing independent bonding layer tests of the first die and the second die using the plurality of bonding layer test lines 540. In a second implementation, alone or in combination with the first implementation, performing the independent bonding layer tests includes performing the independent bonding layer tests prior to performing the independent circuit probe tests. In a third implementation, alone or in combination with one or more of the first and second implementations, forming the plurality of bonding layer test lines 540 includes forming a plurality of bonding pad vias (e.g., the bonding pad vias 546a and/or 546b) of a bonding layer test line 540 of the plurality of bonding layer test lines 540, where the plurality of bonding pad vias are connected to one or more metal pads (e.g., the metal pads 322a, 322b, 422a, 422b, 522a, 522b, 548).

In a fourth implementation, alone or in combination with one or more of the first through third implementations, forming the plurality of bonding layer test lines 540 includes forming a plurality of bonding pad metallization layers (e.g., the metallization layers 544a and/or 544b) connected to the plurality of bonding pad vias, and forming a plurality of test pads (e.g., the test pads 542a and/or 542b) connected to the plurality of bonding pad metallization layers 544. In a fifth implementation, alone or in combination with one or more of the first through fourth implementations, a first control circuit of the plurality of control circuits is configured to selectively block a TSV (e.g., the die-to-die interconnect 326, 426, and/or 526) that connects the first die and the second die, and a second control circuit of the plurality of control circuits is configured to selectively block the subset of the first plurality of circuits. In a sixth implementation, alone or in combination with one or more of the first through fifth implementations, performing the independent circuit probe tests of a subset of the first plurality of circuits and a subset of the second plurality of circuits includes testing, using a circuit probe test circuit of the plurality of circuit probe test circuits, the subset of the first plurality of circuits when the first control circuit blocks the TSV, or testing, using the circuit probe test circuit, the subset of the second plurality of circuits when the second control circuit blocks the subset of the first plurality of circuits.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

As described in greater detail herein, a control circuit is included in a first die of a stacked semiconductor device. The first die further includes a transistor that is electrically connected to the control circuit. The transistor is configured to be controlled by the control circuit to selectively block a die-to-die interconnect (e.g., a wire or a through substrate via (TSV)). In this way, the die-to-die interconnect may be selectively blocked to isolate the first die and a second die of the stacked semiconductor device for independent testing after bonding. This may increase the effectiveness of a CP and/or a WAT to identify and isolate defects in the first die or the second die, which may further increase the effectiveness of performing rework or repair on the stacked semiconductor device.

As described in greater detail above, some implementations described herein provide a stacked semiconductor device. The stacked semiconductor device includes a first die. The stacked semiconductor device includes a second die bonded to the first die. The stacked semiconductor device includes a control circuit, included in the first die, configured to selectively isolate the first die and the second die for testing.

As described in greater detail above, some implementations described herein provide a method. The method includes configuring a control circuit, included in a first die of a stacked semiconductor device, in a first configuration, where the control circuit being in the first configuration causes a transistor in the first die to isolate the first die from a second die of the stacked semiconductor device. The method includes performing a first electrical test of the first die while the first die is isolated from the second die. The method includes configuring the control circuit in a second configuration, where the control circuit being in the second configuration causes the transistor to electrically connect the second die and the first die. The method includes performing a second electrical test of the second die while the second die is electrically connected with the first die.

As described in greater detail above, some implementations described herein provide a method. The method includes forming a first plurality of circuits on a first substrate of a first die, where the first plurality of circuits includes: a plurality of circuit probe test circuits, and a plurality of control circuits. The method includes forming a second plurality of circuits on a second substrate of a second die. The method includes bonding the first die and the second die to form a stacked semiconductor device. The method includes performing, through the plurality of circuit probe test circuits and using the plurality of control circuits to selectively isolate the first die and the second die, independent circuit probe tests of a subset of the first plurality of circuits and a subset of the second plurality of circuits, where the independent circuit probe tests are performed after bonding the first die and the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked semiconductor device, comprising:
   a first die;
   a second die bonded to the first die;
   a control circuit, included in the first die, configured to selectively isolate the first die and the second die for testing; and
   a transistor, connected to the control circuit, configured to:
      when in a first configuration, isolate the first die from the second die such that the first die is configured to be independently tested, and
      when in a second configuration, electrically connect the second die and the first die and block circuits of the first die such that the second die is configured to be independently tested while electrically connected with the first die.

2. The stacked semiconductor device of claim 1, wherein the control circuit is configured to control a gate of the transistor.

3. The stacked semiconductor device of claim 1, wherein the transistor, when in the first configuration, is configured to block a die-to-die interconnect such that the first die is configured to be independently tested.

4. The stacked semiconductor device of claim 1, wherein, when the transistor is configured in the second configuration, the second die is configured to be independently tested through a die-to-die interconnect.

5. The stacked semiconductor device of claim 1, further comprising:
   a test circuit configured to provide a test signal to the first die or to the second die,
   wherein the test circuit is controlled by the transistor.

6. The stacked semiconductor device of claim 1, further comprising:
   a bonding layer test line connected to the first die or the second die for bonding layer testing,
   wherein the bonding layer test line includes one or more of:
      a plurality of test pads,
      a plurality of bonding pad metallization layers, or
      a plurality of bonding pad vias.

7. The stacked semiconductor device of claim 6, wherein the plurality of test pads are on a portion of the first die and are under an around-die dielectric layer.

8. The stacked semiconductor device of claim 1, wherein the stacked semiconductor device comprises at least one of:
   a system on integrated circuit (SoIC) device,
   a chip on wafer on substrate (CoWoS) device, or
   an integrated fanout (InFo) device.

9. A method, comprising:
   configuring a control circuit, included in a first die of a stacked semiconductor device, in a first configuration,
      wherein the control circuit being in the first configuration causes a transistor in the first die to isolate the first die from a second die of the stacked semiconductor device;
   performing a first electrical test of the first die while the first die is isolated from the second die,
      wherein the first die is independently tested;
   configuring the control circuit in a second configuration,
      wherein the control circuit being in the second configuration causes:
         the transistor to electrically connect the second die and the first die, and circuits of the first die to be isolated from the second die; and performing a second electrical test of the second die while the second die is electrically connected with the first die, wherein the second die is independently tested.

10. The method of claim 9, further comprising:

configuring another control circuit in the first die such that another transistor in the first die isolates the second die from the circuits of the first die; and wherein performing the second electrical test of the second die comprises:

performing the second electrical test of the second die while the second die is isolated from the circuits of the first die.

11. The method of claim 9, further comprising:

providing a bonding layer test signal to the first die through a first test pad of a bonding layer test line; and providing a control signal through a second test pad of the bonding layer test line to electrically isolate the first die and the second die while providing the bonding layer test signal.

12. The method of claim 11, further comprising:

providing another bonding layer test signal to the second die through a first test pad of another bonding layer test line; and providing another control signal through a second test pad of the other bonding layer test line to electrically isolate the first die and the second die while providing the other bonding layer test signal.

13. The method of claim 12, wherein providing the bonding layer test signal and the other bonding layer test signal comprises:

providing the bonding layer test signal and the other bonding layer test signal prior to performing the first electrical test and the second electrical test.

14. A method, comprising:

configuring a control circuit, included in a first die of a stacked semiconductor device, in a first configuration, wherein the control circuit being in the first configuration causes a first transistor to block a die-to-die interconnect between the first die and a second die of the stacked semiconductor device;

performing a first electrical test of the first die while the die-to-die interconnect is blocked, wherein the first die is independently tested;

configuring the control circuit in a second configuration, wherein the control circuit being in the second configuration causes:

the first transistor to provide a first conductive path between the first die and the second die, and a second transistor to block a second conductive path between circuits of the first die; and performing a second electrical test of the second die while the first conductive path is provided, wherein the second die is independently tested.

15. The method of claim 14, further comprising:

configuring another control circuit in the first die to cause the second die to be isolated from the circuits of the first die; and wherein performing the second electrical test of the second die comprises:

performing the second electrical test of the second die while the second die is isolated from the circuits of the first die.

16. The method of claim 14, wherein, when in the second configuration, the circuits of the first die are electrically isolated from circuits of the second die.

17. The method of claim 14, wherein configuring the control circuit in the second configuration comprises:

providing a control signal to a gate of the first transistor to permit the first conductive path to form.

18. The method of claim 14, wherein performing the first electrical test of the first die comprises:

performing the first electrical test of the first die using a bonding layer test line.

19. The method of claim 14, wherein configuring the control circuit in the first configuration comprises:

providing a control signal to a test pad of a bonding layer test line.

20. The method of claim 14, wherein the first electrical test is performed before the second electrical test.

* * * * *